US009856563B2

(12) United States Patent
Martinson et al.

(10) Patent No.: US 9,856,563 B2
(45) Date of Patent: Jan. 2, 2018

(54) MICRO-BALANCE SENSOR INTEGRATED WITH ATOMIC LAYER DEPOSITION CHAMBER

(75) Inventors: Alex B. F. Martinson, Woodridge, IL (US); Joseph A. Libera, Clarendon Hill, IL (US); Jeffrey W. Elam, Elmhurst, IL (US); Shannon C. Riha, Park Ridge, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 751 days.

(21) Appl. No.: 13/591,498

(22) Filed: Aug. 22, 2012

(65) Prior Publication Data

US 2014/0053779 A1    Feb. 27, 2014

(51) Int. Cl.
*C23C 16/00* (2006.01)
*C23C 16/455* (2006.01)
*C23C 16/52* (2006.01)

(52) U.S. Cl.
CPC ........ *C23C 16/45525* (2013.01); *C23C 16/52* (2013.01)

(58) Field of Classification Search
CPC ........................... C23C 16/45593; C23C 16/52
USPC ........................................................ 700/121
See application file for complete search history.

(56) References Cited

U.S. PATENT DOCUMENTS

| | | | | |
|---|---|---|---|---|
| 4,362,125 A * | 12/1982 | Schadler | ............. | G01B 17/025 118/664 |
| 5,302,762 A * | 4/1994 | Yamashita | ............... | B01J 8/222 568/835 |
| 5,734,098 A * | 3/1998 | Kraus et al. | ................. | 73/61.62 |
| 5,885,402 A * | 3/1999 | Esquibel | .................. | 156/345.24 |
| 5,948,983 A * | 9/1999 | Gogol, Jr. | ........... | C23C 16/4405 118/664 |
| 6,250,140 B1 * | 6/2001 | Kouznetsov et al. | ............ | 73/86 |
| 6,558,735 B2 * | 5/2003 | Marcus | .................. | C23C 14/12 118/664 |

(Continued)

OTHER PUBLICATIONS

Rev. Sci. Instrum., vol. 73, No. 8, Aug. 2002 to Elam et al , pp. 2981-2987.*

(Continued)

*Primary Examiner* — Gordon R Baldwin
*Assistant Examiner* — Charlee Bennett
(74) *Attorney, Agent, or Firm* — Cherskov Flaynik & Gurda, LLC

(57) ABSTRACT

The invention is directed to QCM measurements in monitoring ALD processes. Previously, significant barriers remain in the ALD processes and accurate execution. To turn this exclusively dedicated in situ technique into a routine characterization method, an integral QCM fixture was developed. This new design is easily implemented on a variety of ALD tools, allows rapid sample exchange, prevents backside deposition, and minimizes both the footprint and flow disturbance. Unlike previous QCM designs, the fast thermal equilibration enables tasks such as temperature-dependent studies and ex situ sample exchange, further highlighting the feasibility of this QCM design for day-to-day use. Finally, the in situ mapping of thin film growth rates across the ALD reactor was demonstrated in a popular commercial tool operating in both continuous and quasi-static ALD modes.

14 Claims, 19 Drawing Sheets

(56) References Cited

U.S. PATENT DOCUMENTS

| | | | | |
|---|---|---|---|---|
| 6,835,275 | B1* | 12/2004 | Grimbergen | H01J 37/321 118/712 |
| 7,582,182 | B2* | 9/2009 | Matsumoto et al. | 156/345.24 |
| 7,709,056 | B2* | 5/2010 | Elam et al. | 427/255.32 |
| 8,889,214 | B2* | 11/2014 | Kim | C23C 16/52 118/712 |
| 9,182,378 | B2* | 11/2015 | Gogol, Jr. | G01N 29/12 |
| 2004/0007073 | A1* | 1/2004 | Weise | G01L 19/0038 73/715 |
| 2009/0133836 | A1* | 5/2009 | Kimball et al. | 156/345.28 |

OTHER PUBLICATIONS

J.W. Elam, et al., Viscous flow reactor with quartz crystal microbalance for thin film growth by atomic layer deposition, Review of Scientific Instruments, vol. 73, No. 8, (Aug. 2002), pp. 2981-2987.

J.W. Elam, et al., ALD for clean energy conversion, utilization, and storage, Materials Research Society Bulletin, vol. 26, (Nov. 2011), pp. 899-906

J.W. Elam, et al., GaPO4 Sensors for Gravimetric Monitoring during Atomic Layer Deposition at High Temperatures, Anal Chem, (2005), 77, pp. 3531-3535.

J.W. Elam, et al., Nucleation and Growth of Noble on Oxide Surfaces Using Atomic Layer Deposition, ECS Transactions, (2007), vol. 3, Issue 15, pp. 271-278.

J.W.Elam, et al., Atomic Layer Deposition of Ir—Pt Alloy Films, Chem. Mater, (2010), 22, pp. 2517-2525.

M.D. Groner, et al., Low-Temperature Al2O3 Atomic Layer Deposition, Chem. Mater., (2004), 16, pp. 639-645.

Alex B.F. Martinson, et al., Electron Transport in Dye-Sensitized Solar Cells Based on ZnO Nanotubes: Evidence for Highly Efficient Charge Collection and Exceptionally Rapid Dynamics, J. Phys. Chem. A (2009), 113, pp. 4015-4021.

Alex B.F.Martinson, et al., Atomic Layer Deposition of Fe2O3 Using Ferrocene and Ozone, Journal of Physical Chemistry, (2011), 115, pp. 4333-4339.

Alex B.F. Martinson, et al., ZnO Nanotube Based Dye-Sensitized Solar Cells, Nano Letters, (2007), vol. 7, No. 8, pp. 2183-2187.

Alex B.F. Martinson, et al., Radial Electron Collection in Dye-Sensitized Solar Cells, Nanon Letters, (2008), vol. 8, No. 9, pp. 2862-2866.

Antti Rahtu, et al., Compensation of temperature effects in quartz crystal microbalance measurements, Applied Physics Letters, vol. 80, No. 5221 (2002), pp. 520-523.

El Bekkaye Yousfi, et al., Study of atomic layer epitaxy of zinc oxide by in-situ quartz crystal microgravimetry, Applied Surface Science 153 , 2000), pp. 223-234.

J. Aarik, et al., In situ characterization of ALE growth by reagent pulse delay times in a flow-type reactor, Applied Surface Science, 75, (1994), pp. 180-184.

\* cited by examiner

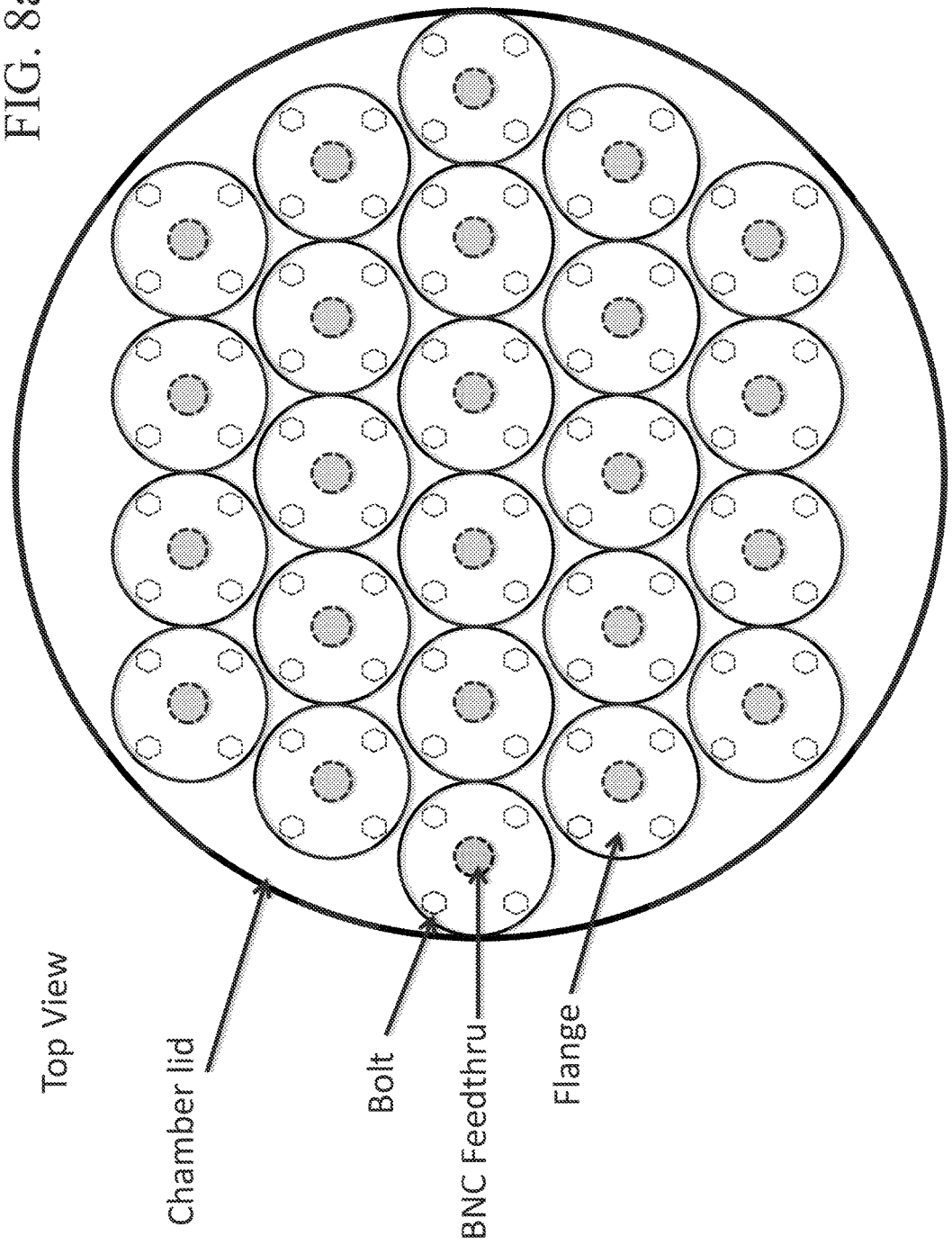

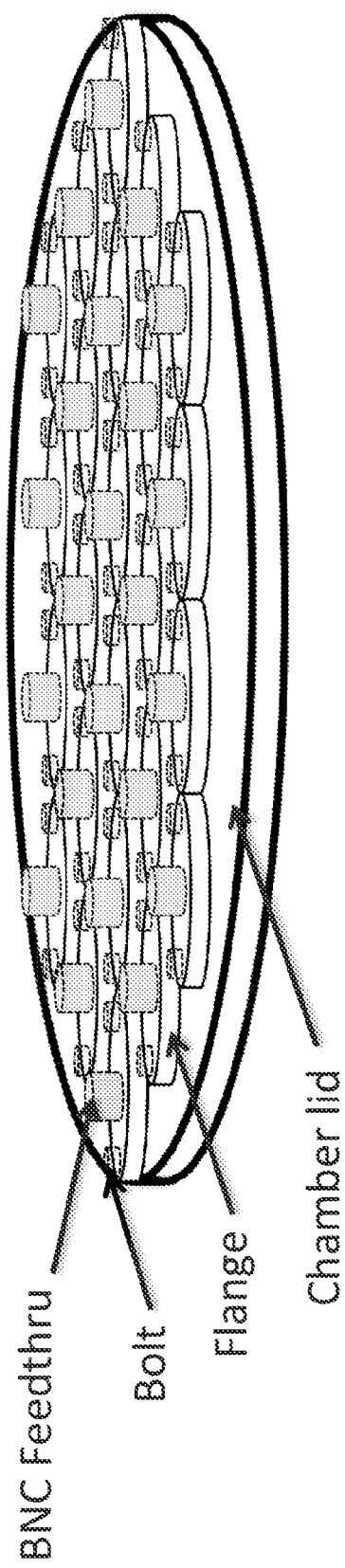

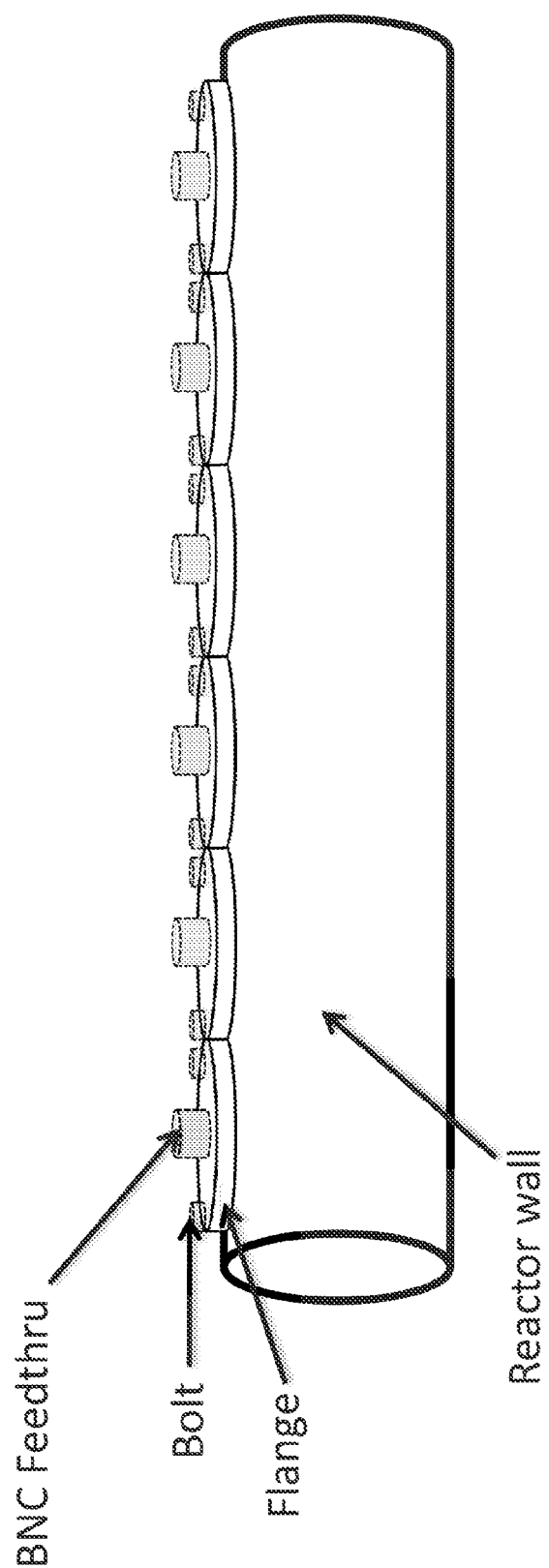

MICRO-BALANCE SENSOR INTEGRATED WITH ATOMIC LAYER DEPOSITION CHAMBER

CONTRACTUAL ORIGIN OF THE INVENTION

The U.S. Government has rights in this invention pursuant to Contract No. DE-AC02-06CH11357 between the United States Government and UChicago Argonne, LLC, representing Argonne National Laboratory.

FIELD OF THE INVENTION

The present invention relates to the field of atomic layer deposition (ALD), and more particularly, this invention relates to a device and method for quantitatively monitoring ALD film thicknesses during their formation.

BACKGROUND OF THE INVENTION

Vapor deposition, in particular physical vapor deposition (PVD) and chemical vapor deposition (CVD), comprises low pressure processes to condense and deposit vaporized material onto workpiece surfaces. PVD involves purely physical processes such as high temperature vacuum evaporation followed by condensation, or plasma sputter bombardment.

CVD employs chemical reactions to produce high-purity, high-performance solid materials. The process is used in semiconductor manufacturing to form thin films. Substrates are exposed to one or more vaporized chemicals which react or decompose on the target surface to produce the desired deposit. Often, volatile by-products are produced. These are removed from the reaction chamber by carrier or reaction gases.

Atomic layer deposition (ALD) is a chemical vapor-based method suited to form conformal films on both planar and complex structures. ALD is based on sequential and self-limiting surface reactions, whereby thin film deposition is controlled by surface chemistry at the atomic scale. ALD typically requires two chemically selective half-reactions utilizing vapor phase chemical species—often an organometallic precursor and a co-reactant such as water, ammonia, or hydrogen sulfide—separated in time or space by an inert gas purge.

During the first half-reaction, a first chemical precursor is introduced into the reaction chamber and reacts with surface species, changing the initial surface termination chemistry, perhaps to contain first precursor moieties. This self-limiting aspect prevents further deposition of the first precursor.

Following a purge step to remove remnants of the first half reaction, a second chemical precursor or reactant contacts the surface until all reactive surface sites have been terminated with the new species. The reaction chamber is again purged to remove unreacted precursors and products. The process is repeated if necessary to attain the predetermined thickness of the film desired One benefit of the self-limiting nature of ALD growth is uniform deposition largely independent of chemical precursor exposure time. This means that even large and long reactant doses—necessary to reach and react with the most distant sites on convoluted, high surface area structures—result in conformal and pinhole-free growth without excess build-up of material on any one region. These features, combined with low growth temperatures and medium vacuum processing, make ALD a suitable vehicle to prepare high quality films of materials such as oxides, nitrides, sulfides, and even pure elements. However, there exists a need for in situ measurements, in particular mass and thickness measurements, to more thoroughly understand the process and rapidly advance the ALD art.

Obtaining accurate measurements of tiny changes in mass during ALD is difficult because state of the art microbalances, such as those utilizing oscillating crystal paradigms, are intended to be operated at room temperature. For example, AT-cut quartz crystals (utilized in quartz crystal microbalances or QCMs) are extremely sensitive to temperature fluctuations when operated at temperatures exceeding 50° C. AT-cut crystals, typically used in sensor applications, comprise quartz blanks formed from a thin plate cut at an angle of about 35° 15' to the optic axis of the crystal. At the intended operating temperature for the AT-cut crystal of 25 Hz/° C. C, the temperature coefficient is 0 Hz/° C. However, at a typical ALD temperature of about 180° C., the temperature coefficient for the AT-cut quartz crystal is 50 Hz/° C. Therefore, a 1° C. temperature increase will result in an apparent change in the ALD $Al_2O_3$ thickness of minus 17 Angstroms (Å), which represents more than 15 ALD coating cycles.

Tight temperature control, e.g., with PID controllers to reduce temperature-induced variations from the mass balance, may not always be practical. Potentials for error increase with increasing temperature, reaching more than 200 Å/° C. under some ALD-relevant conditions. Moreover, thermal transients induced by the ALD precursor exposures cannot be eliminated even using PID temperature controllers.

To minimize the temperature effects of QCM measurements during ALD, another crystal, e.g., a $GaPO_4$ sensor, can be used instead of the traditional AT-cut quartz crystal. Over the range of typical ALD processes (25-400° C.) the temperature coefficient of the $GaPO_4$ sensor is on average, much lower. However, the temperature sensitivity of $GaPO_4$ systems at temperatures less than 150° C. is greater than AT-cut quartz.

Accurately estimating the mass deposited during ALD is further complicated by deposition on both the front and back of the oscillating crystal—an inevitable consequence of the self-limiting surface chemistry.

Several shortcomings limit the utility of oscillating crystal systems for ALD. First, temperature equilibration of conventional QCM sensor heads (i.e., fixture on a stick configurations) requires several hours. This, combined with a significant disturbance of the gas flow dynamics produced by conventional QCM sensor heads, precludes the technique as a routine in situ "monitor" of thickness for co-deposited samples of interest.

Given the growing efforts to develop more effective ALD processes and materials, there exists a need for in situ characterization during regular/normal operation. This in situ characterization should be seamlessly integrated with the ALD equipment for convenience and high throughput. The measurement system should accommodate variations in temperature and process conditions to provide an accurate measurement of the ALD process, and particularly to provide an accurate characterization of films as they are being fabricated. This will allow film thicknesses to be tuned during their fabrication and also allow films to be characterized at several locations of the film surface simultaneously. The system should also provide rapid temperature equilibration after substrate loading, and present a minimal disturbance to the ALD environment. Finally, the system should be easily implemented in a broad variety of ALD equipment platforms having different sizes, shapes, and configurations.

SUMMARY OF INVENTION

An object of the invention is to provide a film deposition monitoring process that overcomes many of the disadvantages of the prior art.

Another object of the present invention is to provide a microbalance that can measure deposition rates in situ in an ALD reactor during regular/normal operation. A feature of the invention is that the microbalance is located within the ALD deposition chamber. An advantage of the invention is that it provides real time information of the film deposition rate. Another advantage is that the invention's feature of having the QCM mount in thermal and fluid communication with the ALD reactor results in thermal and fluid conductance of ALD reaction chamber conditions, thereby providing equilibration between the ALD and QCM in as little as about 15-20 minutes.

Another object of the present invention is to integrate oscillating crystal microbalances with ALD equipment. A feature of the invention is that the device has a small "foot print" to permit easy installation through small aperturea in the wall of the reactor of the ALD tool. An advantage of the invention is installation can be achieved with minimal modification of the ALD instrument, and minimal disruption to the ALD process. The feature facilitates the installation of a plurality of crystals in the ALD reaction chamber to enable high resolution mapping of several locations of the film being produced.

Another object of the present invention is to reduce measurement errors and potential electrical shorting that may result from a deposition on the unintended side of the crystal exposed to an ALD reaction environment. A feature of the invention is to provide pressure balancing on a first surface of a mass microbalance while inhibiting flow of deposition moieties to all other surfaces of the microbalance. An advantage of the invention is simultaneously limiting access for deposition to only one crystal surface while maintaining the entire crystal under reaction conditions of the deposition reaction chamber.

Another object of the invention is to permit oscillating crystal microbalances to be operated in an ALD reaction chamber, over a temperature range of between about 25° C. and 300° C. A feature of the invention is to expose the crystal to an ALD deposition environment (including reaction pressures and temperatures) while providing a structure to dissipate heat in a manner that minimizes temperature fluctuations across the crystal. An advantage is that the crystal is located in or adjacent to the ALD environment thereby providing a means to rapidly equilibrate the QCM with the ALD environment in a period of as little as 20 minutes. This minimizes temperature fluctuations and also minimizes the time delay between introducing a substrate into the ALD reactor and achieving a sufficiently stable QCM baseline signal to begin ALD growth and thickness measurement.

In brief, the invention provides a device for measuring deposition rate of a substance onto a substrate, the device comprising a reaction chamber; an aperture in the chamber; a piezoelectric element within the aperture, whereby a first region of the piezoelectric element is in fluid communication with the chamber and the second region is isolated from the chemical reactants in the reaction chamber; a means for equalizing pressure between said first region and a second region of the piezoelectric element; a means to induce oscillation of the piezoelectric element at a first frequency wherein a change in the oscillation of the piezoelectric element is proportional to the deposition of the substance on the first region of the piezoelectric element.

The invention provides a device and process for measuring deposition rates in an ALD with minimal modification to the ALD device.

BRIEF DESCRIPTION OF DRAWING

The invention together with the above and other objects and advantages will be best understood from the following detailed description of the preferred embodiment of the invention shown in the accompanying drawings, wherein:

FIG. 1b is an enlarged view of a region of the configuration circumscribed in dotted line FIG. 1a;

FIGS. 8A-B are plan and elevated views respectively of multi-oscillating crystal configurations for a disk-shaped ALD reactor lid geometry, in accordance with features of the present invention; and FIG. 9 is a schematic view of a multi-oscillating crystal configuration, wherein the crystals are arranged along a longintudinally extending region of a cylindrically-shaped ALD reactor, in accordance with features of the present invention.

DETAILED DESCRIPTION OF THE INVENTION

Figure 1A:
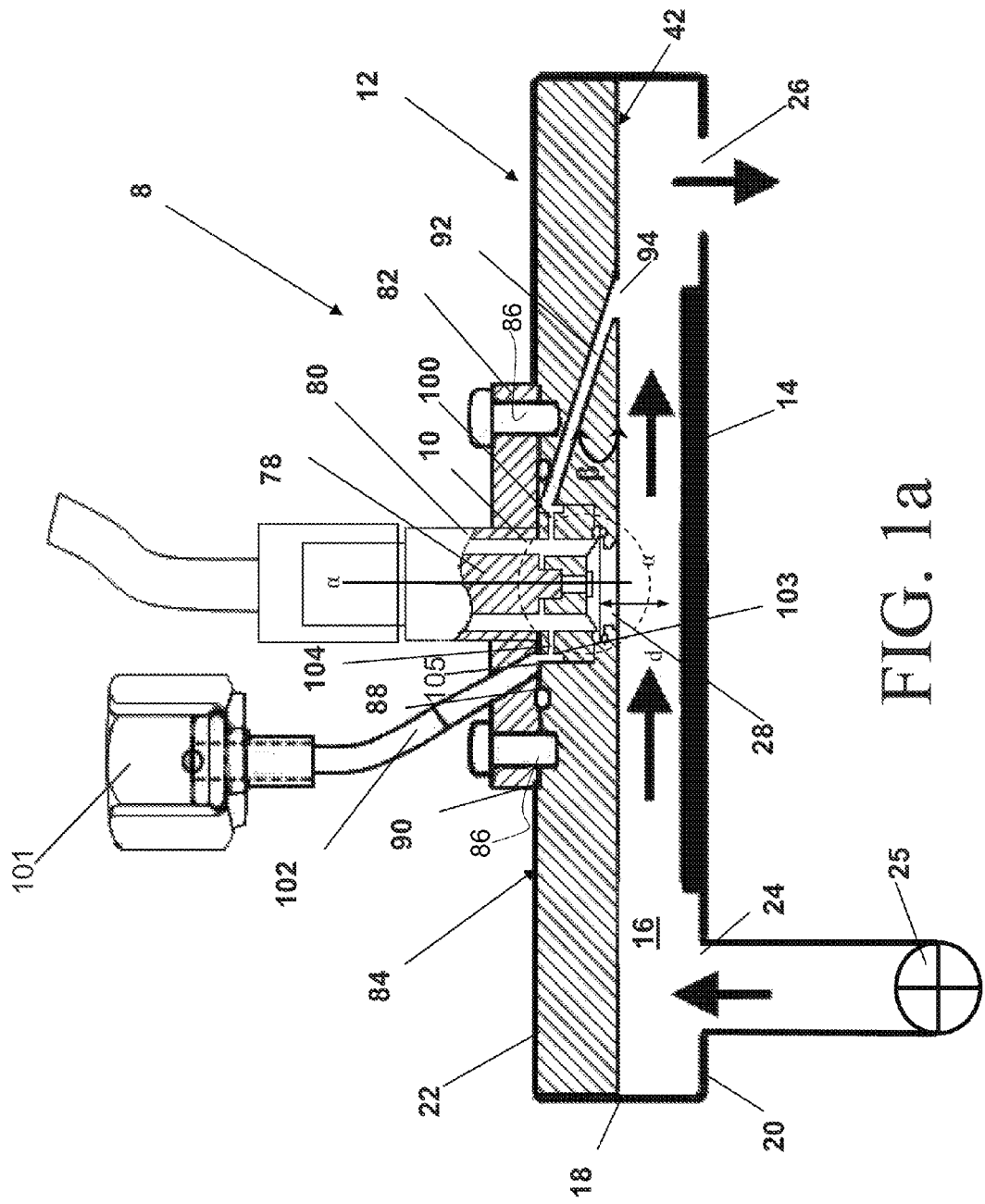
FIG. 1a is an elevational schematic view of an ALD-crystal balance configuration, in accordance with features of the present invention.

The foregoing summary, as well as the following detailed description of certain embodiments of the present invention, will be better understood when read in conjunction with the appended drawings.

As used herein, an element or step recited in the singular and preceded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invention provides a modified ALD chamber featuring an exterior surfaced mounted and accessible oscillating crystal mass measuring device capable of measuring mass changes as little as 0.1 ng/cm². An embodiment of the microbalance comprises a sealed QCM integrally molded with the chamber interior. This design contrasts with traditional 'fixture-on-a-stick' paradigms whereby microbalances, protruding into reaction chambers, alter normal laminar flow patterns, cause dead zones which are insufficiently purged, and ultimately produce distortions in deposition layer thickness. Fixture-on-a-stick paradigms also prevent the ability to map the film simultaneously at several locations.

Instead, the invented paradigm provides improved temperature adjustment and pressure compensation while solving aforementioned problems associated with prior devices. The invented integrated oscillating crystal paradigm is suitable for use with other types of vapor deposition reactors. Further, the invented system allows for mapping of a films at several locations across the film.

Piezoelectrics, and in particular quartz crystal microbalances have been used in conventional vacuum processes where thickness measurements are valuable, for example in thermal evaporation. QCM measurements provide an in situ method for measuring growth rates and nucleation phenomena, optimizing processing conditions, and elucidating surface reaction mechanisms.

An embodiment of the invention is a piezoelectric microbalance integrated with an atomic layer deposition device. In an embodiment of the invention, a piezoelectric microbalance is removably integrated with an ALD reaction chamber while simultaneously providing a low internal profile. This low profile provides a means to minimize disruption of reactor gas flow This invention envisions the piezoelectric microbalance, such as a QCM crystal, reversibly mounted to a reactor wall, lid, flange or floor of an enclosure defining the reaction chamber of the ALD device. As such, the design provides a low internal profile, which is suitable to most reactor geometries. The design allows for thermal equilibration with the crystals and the workpiece being coated. Generally, the materials used for these aspects of the system are tolerant at high temperatures (e.g., from about 300 to 450° C.).

In specific embodiments of the invented ALD/crystal microbalance system, the microbalance is recessed from the reactor space a distance of between about 1.0 mm and 2.0 mm. In another embodiment the microbalance is flush with the interior surface of the reactor. The invention allows for modification of the extent of protrusion or recession of the microbalance out of or within the interior surfaces of the walls of the same reaction chamber. As such, the microbalance can be reversibly set to various positions within the ALD reaction environment. This allows users to tune the microbalance for optimal reading of the deposited film, depending on gas flow, temperature, reaction rate desired, etc.

An embodiment of the invention is designated as numeral 8 in FIG. 1a. An oscillating crystal microbalance, such as a QCM unit 10 is shown reversibly attached, such as by male-female threaded interaction, to an ALD reactor 12. The ALD reactor 12 facilitates vapor deposition of chemical moieties onto a workpiece 14 positioned within the ALD reaction chamber 16.

The ALD reaction chamber 16 is defined by a wall 18 integrally molded to a base 20, the combination of which defines a side and bottom surface respectively of the reaction chamber. A top of the reaction chamber is defined by a removably attachable lid 22, such that an inwardly facing surface 42 of the lid opposes an inwardly facing surface of the bottom surface of the reaction chamber. This inwardly facing surface 42 defines the ceiling of the reaction chamber. In an embodiment of the reaction chamber, the lid 22 is in pivotable communication with a lip defining the periphery formed by the upwardly extending wall 18.

Reactants enter the ALD reaction chamber 16 through a region of the bottom surface forming an aperture 24. The reactants originate from a lower preprocessing chamber (not shown). Optionally, the aperture is in fluid communication with a valve 25 to regulate flow of reactant from its preprocessing chamber to within the chamber 16. The flow in the ALD reaction chamber 16 from the upstream inlet 24 to a downstream outlet 26, in a generally laminar flow pattern (as shown by arrows) which deposits material on all chamber surfaces, including the target workpiece 14. The target workpiece 14 is supported by the base 20 and in a position to be directly opposed to the underside (i.e, the inward directed surface) 42 of the conductive lid 22.

The conductive lid 22 defines one or a plurality of apertures 28 adapted to slidably receive a first end of a hollow annular connector 80. A myriad of connectors are available including the a standard Bayonet Nut Coupling Bayonet Neill-Concelman (BNC) connector, also known as the Bayonet Neill-Concelman connector. A depending or mating end (mating with lid) of the connector is in close spatial relationship to a microbalance crystal 30.

In an embodiment of the invention, the crystal 30 is arranged such that the plane defined by the crystal is parallel to the workpiece 14 being coated. This position assures accurate monitoring of material thickness applied to the workpiece 14 during the deposition process while at the same time minimizing modification of the flow patterns within the ALD reaction chamber 16. Location of the QCM unit 10 from the workpiece varies from about 1 mm to about 400 mm, and typically the distance is about 40 mm. An exact location is empirically determined, based on reactant type, gas flows, temperatures etc. Location selection is made to minimize any impact on reactant flow gas patterns so as to enable accurate thickness monitoring.

For a large area workpiece 14 one may utilize several QCM units 10, while for a small substrate one utilizes a single QCM 10 substantially directly opposing the planar surface defining the workpiece 14. The QCM units 10 are reversibly mounted to the lid 22 in a transverse configuration so that the distance "d" between the crystal and the workpiece 14 can be modified. Generally, distances between about 1 and 40 millimeters (mm) are suitable distances for "d" to afford film growth on the crystal 30 that is similar (or proportional to) the growth rate on the opposing workpiece.

As used herein, "chamber-side" or "internal" defines a surface adjacent to or in fluid communication with chamber 16 of the reactor. "Exterior" or "external" descriptors refer to structures not in fluid communication with the reaction chamber. Ambient conditions are construed herein as including atmospheric pressure, humidity and temperature.

Figure 1B:
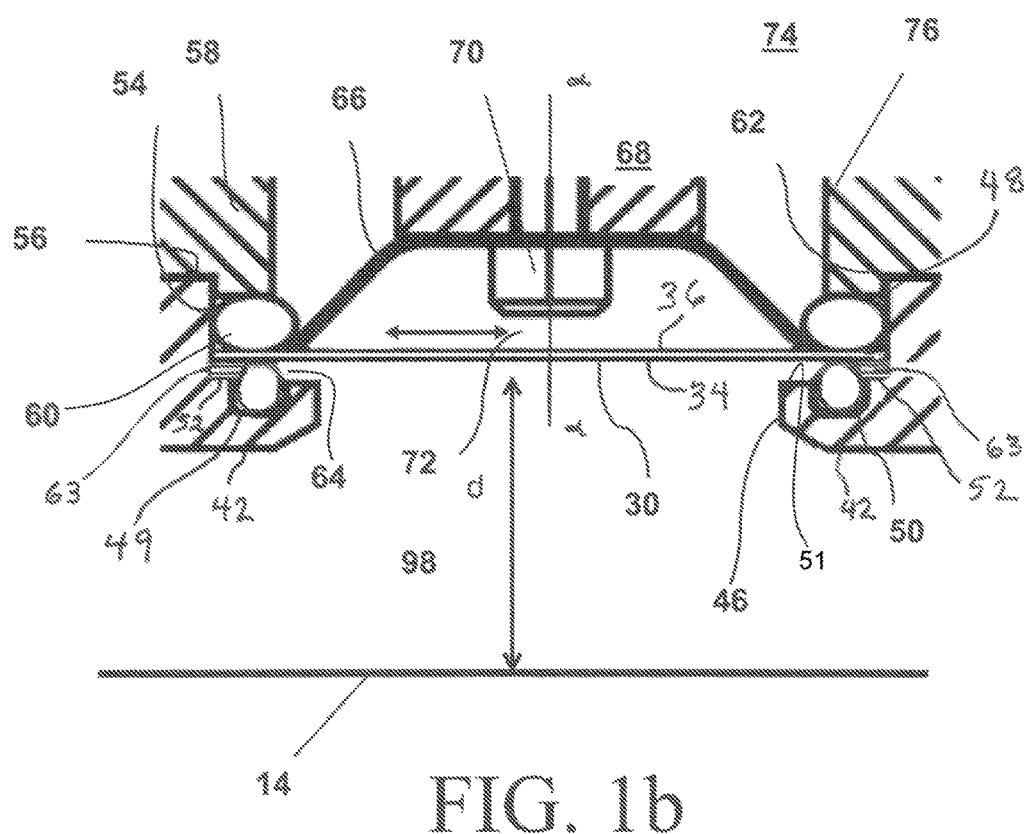
Figures 1C, 1D:
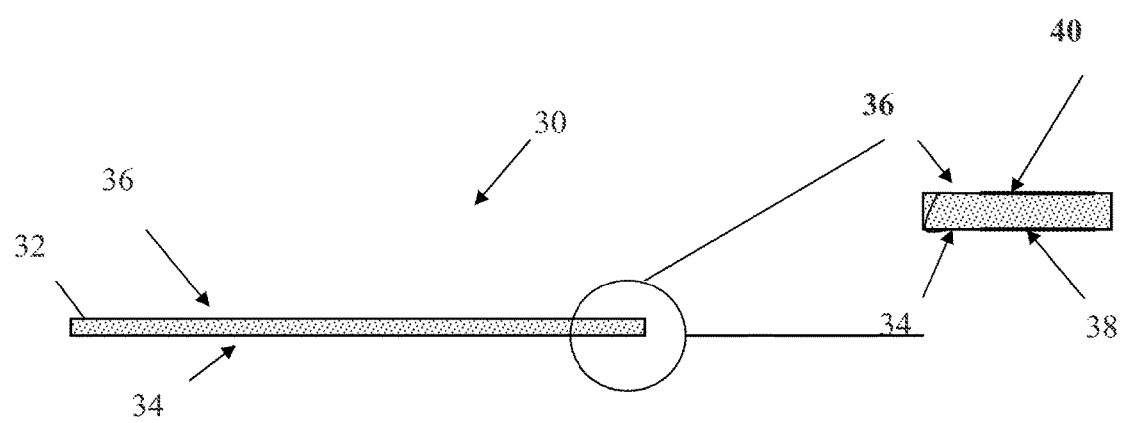
FIG. 1c is an elevated cross-sectional view of a crystal, in accordance with features of the present invention.
FIG. 1d is a cross-sectional view of edge details of a piezoelectric crystal microbalance, in accordance with features of the present invention.

FIG. 1b depicts the mounting of a QCM unit 10. Each aperture 28 is adapted to slidably receive a disk-like piezoelectric planar disc 30, as shown in FIGS. 1c and 1d, having a radially outer edge 32 and coated on the "chamber-side" 34 and "exterior" 36 surfaces with conductive layers 38 and 40.

The aperture 28 defines a plurality of grooves 48 circumscribing the periphery of the aperture 28, each of said grooves adapted to receive an O-ring. At least two of the grooves are axially displaced from each other a distance to facilitate a frictional fit of a periphery of the planar disc 30 between O-rings nesting in said at least two of the grooves. More than two grooves can be provided so that several pairs of adjacent grooves can be chosen to removably position the disc 30. This provides the adjustability of the distance "d" discussed supra between the disc 30 and the substrate.

In an embodiment of the invention, the aperture 28 has the following structure, as shown in FIG. 1b. (In this embodiment, as used herein surfaces parallel to the axis a of the aperture will be described as "vertical" and surfaces perpendicular to a longitudinal axis a of the aperture will be described as "horizontal" although other orientations for a are possible. 'Up" designates a vertical displacement directed towards the exterior to the chamber lid and "out" a radial displacement away from the axis. "Down" and "in" are opposite to up and out.)

A salient feature of the invention is that all electricity sources to the crystal are integrally formed with the ALD body such as its sides, floor or ceiling. This obviates the need for wires to traverse the ALD reaction chamber interior, which otherwise may disrupt film forming chemistries. For illustrative purposes only, the accompanying figures show the electricity sources molded with the ceiling or lid of the chamber.

A medially facing, transversely extending surface 46 of the lid 22 extends axially (in relation to line α-α) and away from the chamber-side surface 42 of the lid 22. A surface 51, integrally molded with the transversely extending surface 46 extends laterally from the transversely extending surface 46 and defines a first annular groove 49. This first annular groove 49 is adapted to frictionally receive a first O-ring 50. The groove 49 is bordered on its laterally (i.e. outer) edge by a conductive ledge 52. The piezoelectric planar disc 30 is positioned so that its reaction chamber-side surface 34 is in electrical contact with the ledge 52. Alternatively, the inferior face (i.e., the reaction side surface) of the piezoelectric substrate 30 is in electrical contact with an electrically conductive spacer 63 or a plurality of washers, such as a washer. The washer(s) 63 in turn are supported by the conductive ledge 52. These spacers provide additional means to vary the distance d of the piezoelectric substrate 30 from the workpiece 14.

A second retaining wall 54 extends axially from the conductive ledge 52. The second retaining wall 54 borders a plateau 56 extending horizontally and laterally. The plateau 56 defines the bottom of a cylindrical cavity having an opening facing in a direction opposite the location of the ALD chamber. The cavity is dimensioned to removably receive an O-ring compression sleeve 58. In an embodiment of the invention, the sleeve 58 interacts with the cylindrical cavity in a male-female threaded configuration, or a snap fit configuration.

The chamber-side conductive layer surface 38 of the piezoelectric disc 30 is supported by and in electrical contact with the conductive ledge 52, or alternatively the electrically conductive spacer 63. The conductive ledge 52 is integrally molded with the lid 22 and thus provides an electrical ground for the system. The chamber-side O-ring 50 contacts a peripheral edge of the chamber-side surface 34 of the piezoelectric disc 30 (thereby establishing a gas tight seal upon downward compression of the piezoelectric disc 30 upon application of the compression sleeve 58.

The second (i.e. exterior) O-ring 60 adjacent to the peripheral edge 32 of the piezoelectric disc 30 provides uniform downward compression to the piezoelectric disc 30.

Upon installation to the lid 22, the exterior chamber-side extending tab 62 of the O-ring compression sleeve 58 provides axial, medially directed (i.e. inwards) mechanical pressure to the lid, thereby compressing to the O-rings to form a peripheral seal to both sides of the disc 30.

For example, as depicted in space in FIG. 1b, a downwardly directed force applied by the compression sleeve 58 toward the chamber on O-ring 60 engages radially the peripheral edge 32 of the piezoelectric disc 30 between the exterior O-ring 60, the conductive ledge 52 and the chamber-side O-ring 50, so as to provide a hermetic seal. As the seal is effected via compression of the disc between two reversibly deformable substrates, substrates other than O-rings are suitable, such as gaskets comprised of rubber, silicone, polymer and malleable metal, In the embodiment shown, the two O-rings provide a gas-tight seal and provide a means to maintain the reaction environment at a different pressure, temperature, and/or reactant concentration different than the environment external of the ALD chamber. A gap 64 between the upper edge of the inward retaining wall 46 and chamber-side surface 34 of the piezoelectric disc 30 adjacent to the radially outer edge 32, permits the efficient purge of the surfaces in the vicinity of the contact area between the piezoelectric disc 30 and the chamber-side O-ring 50. Preferably, the length to height ratio (L:H) of the gap 64 is unity. However, a L:H ratio of between 1:1 and 10:1 is suitable.

The system utilizes a resilient/spring electrode manufactured from a metal form having a center aperture therein. A ring in the central region thereof having a plurality of spokes emanating radially there are bent at an angle of about 45° from the horizontal. The ends of the spokes are rounded to permit contact with the external conductive surface 40 of the piezoelectric disc 30 without scratching the surface.

The resilient/spring electrode 66 engages the exterior surface 36 of the piezoelectric disc 30 to establish electrical contact with the exterior conductive layer 40 of the piezoelectric disc 30 and thus provide power to oscillate the piezoelectric disc 30. The frusto-conical shaped resilient/spring electrode 66 is fixedly attached to a coupler 68 with a threaded fastener 70. The void space 72 between the threaded fastener 70 and exterior surface 36 of the piezoelectric disc 30 provides space for undampened oscillation of the piezoelectric disc 30. The annular void space 74 between the radially inward wall 76 of the O-ring compression sleeve 58 and coupler 68 provides a gas flow path.

The resilient/spring electrodes 66 can be in the form of a frusto-conical structure as shown in FIG. 1b or in the form of a cone or similar structure. The frusto-conical structure can comprise a webbing or sheeting, or a plurality of webs supported by a plurality of radially directed ribs anchored at their proximal ends to the connector When alternating current is provided through the resilient/spring electrode 66 between exterior surface 36 of the piezoelectric film and the conductive ledge 52, the crystal oscillates transversely, in a direction perpendicular to the axis a, (i.e., side-to-side) as shown by vertical double arrow in FIG. 1b. Variation in QCM oscillation frequency is measured by instrumentation.

The QCM unit 10, as discussed hereinabove is an integral part of the ALD reactor 12 as shown in FIG. 1a. It allows rapid replacement of the piezoelectric disc 30. The resilient/spring electrode 66 is secured with a threaded fastener 70 to the base of the coupler 68 attached to an axial pin/post 76 of a shaft 78 with threaded fastener 70. The shaft 78 is contained within a hollow annular connector 80. The connector 80 is affixed to a mounting plate 82 which is in turn attached to the exterior surface 84 of the ALD reactor 12 with mounting fasteners 86. O-rings 88 provide a gas tight seal between a chamber-side facing surface 90 of the mounting plate 82 and the exterior surface of the ALD reactor 24. The gas-tight seal provides control of the reactor environment.

Pressure Equalization

Detail

Balancing the pressure between the exterior surface 36 and chamber-side surface 34 of piezoelectric disc 30 is performed by two separate components, a pressure equalization means and a purge gas flow means.

To equalize pressure on the QCM unit 10, i.e., to minimize the effect of a pressure differential between the chamber and the outside on the oscillation of the piezoelectric disc 30, a channel 92, integrally formed with the housing of the ALD device, and terminates at a first end as an aperture 94 formed in a region of the chamber-side surface 42 of the lid. The aperture 94 serves as a means of egress of pressurized fluid applied to the top side of the crystal. The gas has slightly positive pressure relative to the ALD chamber to ensure an inert gas flow always flows out from the exterior surface 36 of the crystal and toward the ALD reaction chamber. This provides a means for impeding diffusion of chemicals back to the exterior surface of the crystal 36).

The aperture 94 is positioned downstream of the deposition zone 98. However, the aperture may be positioned anywhere along the surface of the reaction chamber so as to facilitate pressure equalization between the chamber side 34 and the exterior side 36 of the piezoelectric substrate 30. A second end of the channel 92 terminates as an exhaust channel 100 which is hi fluid communication with the exterior surface 36 of the piezoelectric film 30. In an embodiment of the invention, the channel 92 extends radially through the compression sleeve 58 to the annular void space 74. This provides a pressure equalization conduit between the chamber-side surface 34 of the piezoelectric film 30 and the exterior surface 36 of the film. An embodiment of the invention comprises an angled channel 92, whereby the channel extends from the ALD chamber side at an angle β. In this embodiment, the angle is chosen to maximize the length of the purge gas channel 92 to prevent backwash of ALD moieties to the exterior surface 36 of the crystals.

To minimize reactant back-flow through the channel 92, from the reaction chamber 16 to the annular void space 74, the channel is charged with an inert gas stream. The inert gas is supplied from an exterior source via a coupler 101 such as a male-female or snap fit coupling. Intermediate the coupler and the void space 74, and in fluid communication therewith is positioned a conduit 102. A proximal end is removably attached to the coupler 101 while a distal end 105 terminates at a point in close spatial relationship to a purge gas inlet channel 104. Positioned between the distal end 105 and the inlet channel 104 is a purge gas vestibule 103 adapted to receive the incoming purge gas. The vestibule 103 and inlet channel 104 are integrally molded with regions of the O-ring compression sleeve 58 and in fluid communication with each other. The inlet channel 104 extends radially through the compression sleeve 58 and terminates in the void space 74 defining the interior surfaces of the hollow annular connector 80.

In operation, an inert gas flows through the conduit 102 to inlet channel 104 to flow into annular void space 74. The inert gas exits the annular void space though an exhaust channel 100 integrally molded with the compression sleeve 58. Preferably the exhaust channel is opposed to the inlet channel 104. This provides a means for assuring thorough purging of the void space prior to the purge gas exiting the void space through the egress channel 100.

Upon passing through the egress channel 100, the gas flows through angled channel 92 and exits the channel via entry port 94 into the ALD reaction chamber 16. A low volume flow of gas prevents back-flow of reactants into the annular void space 74 and deposition onto the exterior surface 36 of the piezoelectric planar disc 30.

Figure 1E:
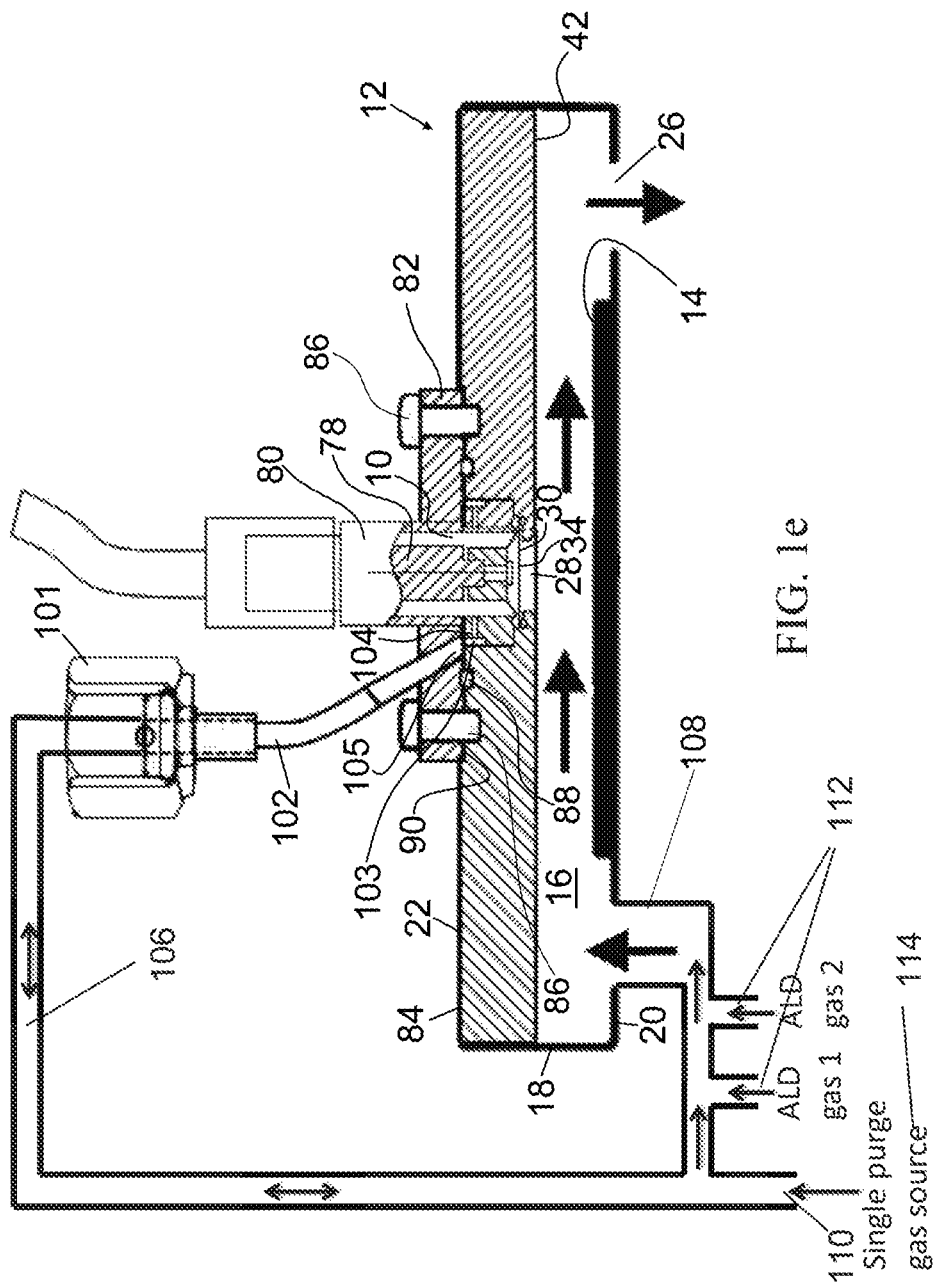
FIG. 1e is a schematic view of the invention depicting an external pressure equalization conduit, in accordance with features of the present invention.

In another embodiment of the invention, as shown in FIG. 1E, an alternate pressure equalization means is illustrated. An exterior pressure equalization conduit 106 establishes fluid communication with the vertical connecting channel 103, which intersects the inlet channel 104 passing into annular space 74 balancing the pressure between annular chamber 74 and carrier gas line 108 at the entry point 110 upstream of chemical reactant inlets 112.

Compared to the effects of the internal pressure equalization conduit 92 depicted in FIG. 1A, the exterior pressure equalization conduit 106 prevents chemical precursor gases from diffusing to the back side (i.e., exterior surface 36) of the crystal where coating is undesired. Also, the exterior routed conduit 106 provides a simplified fixture where the diagonal channel 92 for backside purge gas need not be drilled at a high angle, thereby simplifying ALD chamber lid 22 fabrication.

The externally-routed pressure equalization conduit further reduces flow disturbances from the backside purge gas near the workpiece. This is due to a single purge gas source 114 which provides a means for charging both sides of the crystal 30 at the same pressure and volume. The single purge gas source provides a means to for charging the exterior side 36 of the crystal, the interior side 34 of the crystal, and the ALD reaction chamber with an inert gas all at the same pressures and volume. The inventors surmise that the external conduit scheme is better at maintaining matching pressure on both side of the crystal, compared to the heretofore described internally routed pressure equalization conduit scheme where the pressure behind the crystal is influenced by both the chamber pressure (through 94) and the steady, externaly provided inert gas flow through 102.

In an embodiment of the invention, the piezoelectric disc 30 is a quartz crystal microbalance (QCM) sensor crystal. In another embodiment of the invention, the piezoelectric microbalance is a $GaPO_4$ crystal.

The small footprint on the external surface of the ALD, approximately between 7 and 20 $cm^2$ and preferably about 16 $cm^2$ external to the ALD reaction chamber and between 0.5 and 1.5 $cm^2$, and preferably about 0.75 $cm^2$ on the internal surface of the ALD chamber—further allows for installation of a plurality of microbalance crystals enabling in situ evaluation of film thickness uniformity profiles over a large expanse of the reactor.

Microbalance

Detail

A myriad of crystal constituents are suitable for use in the invention. Generally, high temperature (e.g. approximately 50-450° C.) crystals are suitable, such that the crystals maintain their structural and electrochemical characteristics throughout the deposition temperatures utilized. AT-cut crystals, IT-cut crystals, FC-cut crystals, RC-cut crystals, SC (Stress Compensated)-cut crystals, and super quartz crystals are suitable, among others. AT-cut crystals and RC-cut crystals are preferred.

Also, the inventors found that typography of the crystals plays a role in their suitability. While a myriad of crystal typographies are suitable, polished crystals (to a roughness of between 1 and 20 nm, are preferable. Crystals with a roughness of approximately 5 nm are most preferable. In instances where unpolished crystals are utilized, sealing means other than O-rings are preferable, those sealing means including polymer washers, malleable metal washers, and reversibly deformable substrates, all discussed elsewhere herein.

QCMs or alternately gallium orthophosphate ($GaPO_4$) crystal microbalances are mass sensors capable of measuring mass fluctuations as low as 0.1 ng/cm². Based on the piezoelectric effect, the sensors utilize an alternating current applied to the crystal to induce a resonant oscillation at a frequency dependent upon on the crystal thickness. As mass is deposited on (or removed from) the surface of the quartz crystal, the frequency of oscillation changes. Using the Sauerbrey equation, stated below as Equation 1, the frequency change is correlated to a change in mass.

The Sauerbrey equation is depicted in Equation 1, infra:

$$\frac{\Delta m}{A} = \frac{N_q \rho_q}{\pi Z f_L} \tan^{-1}\left[ Z \tan\left( \pi \frac{f_U - f_L}{f_U} \right) \right] \quad \text{Equation 1}$$

where $f_L$ Frequency of loaded crystal (Hz), $f_U$—Frequency of unloaded crystal, i.e. Resonant frequency (Hz), $N_q$—Frequency constant (For AT—cut quartz crystal, $N_q = 1.668 \times 10^{13}$ Hz Å), $\Delta m$—Mass change (g), A is the piezoelectrically active crystal area (Area between electrodes, cm²), $\rho_q$ is the density of piezoelectric, and $$Z = \sqrt{\left( \frac{\rho_q \mu_q}{\rho_f \mu_f} \right)}$$

where $\mu_q$ is the shear modulus of Piezoelectric (for quartz $\mu_q = 2.947 \times 10^{11}$ g/cm·s²), $\mu_f$ Shear modulus of film (varies units g/cm·s²), and $\rho_f$ is the density of film (g/cm³)

Example

To illustrate the application of the integral QCM design, of the invention, a commercially available aluminum slab lid of an ALD (for example, a Savannah 200 ALD (Cambridge Nanotech, Inc., Cambridge, Mass.) was modified to accommodate two oscillating crystal fixtures. Compression seal sleeves and apertures were machined to appropriate dimensions to produce O-ring compression compatible with published O-ring specifications and QCM crystal thickness.

Electrical connection to the front of the gold plated QCM crystals is achieved through direct contact with the aluminum ALD lid by means of edge 52, which is in turn grounded to the Connector shield by the feed through. Electrical connection to the exterior surface of the QCM crystal was achieved with a resilient/spring retainer electrode modified and fitted on a connector shaft. The connector fixture was bolted onto the lid with mounting plate and fasteners were inserted in drilled and tapped holes. Tightening of the fasteners compressed a Kalrez O-ring in an annular groove, forming an airtight seal. Markez 75 D high temperature O-rings on the exterior side of the QCM crystal are compressed by a compression sleeve/seal, as shown in FIG. 1a to ensure a vacuum-tight seal to the reaction chamber and uniform crystal compression. Because QCM crystal interior/flow surface contacts are made directly to the machined medially or inwardly directed edge 38, there is no need for the conductive epoxy that is required in the prior art (Elam et. al., Rev. Sci. Instr. 73, 2981-2987 (2002). As such, the lip/O-ring seal combined with edge and chamber side O-ring allow for clean and rapid crystal exchange in addition to potentially longer crystal lifetimes Implementation of Integral QCM
For ALD Reactor Conditions Production of $Al_2O_3$ in a modified ALD reactor as discussed hereinabove was chosen to evaluate the performance of the integral QCM. Measurements were carried out in a Savannah 200 ALD reactor (Cambridge Nanotech, Inc.), adapted as discussed hereinabove, using trimethylaluminum (TMA), and water (18 MΩ, Milli-Q system) at a reaction temperature of 190° C. The pressure in the ALD chamber was maintained at 300 mTorr—when no precursors were pulsing—by the continuous flow of ultra-high purity nitrogen (20 sccm) and rough pumping (Adixen Pascal 2500I, Hingham, Mass.). In continuous flow mode, the conventional ALD pulse sequence was used ($t_1$-$t_2$-$t_3$-$t_4$) where $t_1$ is the pulse time for the TMA, $t_3$ is the pulse time for $H_2O$, and $t_2$ and $t_4$ correspond the TMA and $H_2O$ purge times, respectively. All units are given in seconds. In some cases, quasi-static mode was employed to simulate the conditions required for conformally coating high aspect ratio samples. In this mode, the pneumatic valve that provides access to the pump was closed prior to precursor dosing and remained closed while the chemical precursors were allowed to diffuse. Here, the timing sequence was $[t_1$-$t_{1'}]$-$t_2$-$[t_3$-$t_{3'}]$-$t_4$, where $t_{1'}$ and $t_{3'}$ refer to the exposure times for the TMA and water, respectively.

Because even the shortest 15 ms pulses of TMA and water saturate the relatively small reactor, ALD $Al_2O_3$ was not a suitable choice to evaluate the capability of mapping film growth. Instead, the ZnS ALD was selected as it too has a known chemistry and reaction rate and the delivery of 1% in $N_2$ $H_2S$ can be reduced to sub-saturating conditions through the use of a pressure regulator. During the deposition of ZnS, diethylzinc (DEZ) and $H_2S$ were maintained at room temperature while the ALD chamber temperature set to 140° C. (While 1% $H_2S$ in $N_2$ is highly toxic, it is not flammable. The tool was modified for compatibility with the corrosive gas.) The $H_2S$ was delivered to the manifold through a 0.3 mm orifice (Lenox Laser) with a delivery pressure of −710 Torr gauge pressure. The pulsing sequence was similar to that for TMA/$H_2O$, where here $t_1$=DEZ pulse time, $t_3$ is the $H_2S$ pulse time, and $t_2$ and $t_4$ are the purge times for the DEZ and $H_2S$, respectively.

Thermal Equilibration
and Stability Detail

Figure 2A:
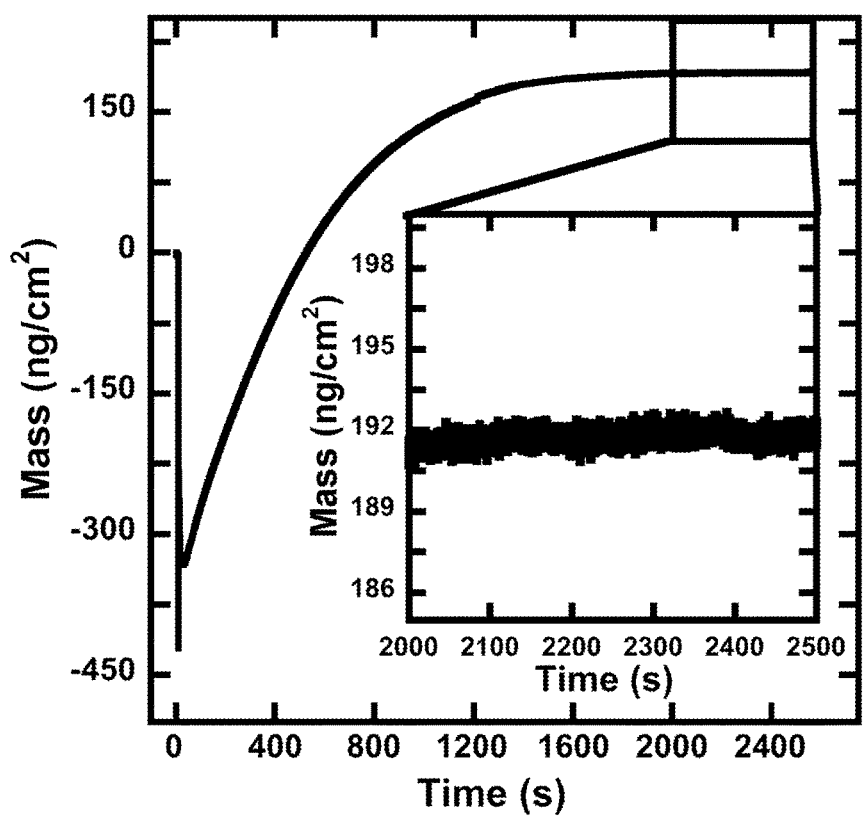
FIG. 2a is a graph of QCM signal plotted versus time following reactor evacuation and sample exchange.

A number of disadvantages of the "fixture on a stick" or standard straight line QCM probe are its limited utility to monitor routine depositions on sample coupons and devices. Additionally, insertion of the probe in an ALD reactor alters normal laminar flow patterns, causing dead zones, producing distortions in deposition layer thickness. Due to the long equilibration times associated with convective heating and stainless steel construction, temperature-dependent studies or tasks as simple as ex situ sample exchange are burdensome and slow. As such, the "fixture on a stick" QCM is restricted to systematic and dedicated studies of ALD processes. In contrast, for the design of the invention presented herein, the QCM crystal is mounted directly on the aluminum ALD lid, providing rapid thermal equilibration. FIG. 2a shows the thermal equilibration time—the point at which the signal drift becomes less than a fraction of a monolayer (a few ng/cm$^2$)—for the QCM sensor at 190° C. The initial transient in the trace at time=0 seconds corresponds to when, after samples were exchanged, the reactor lid was closed and the system pumped back down to vacuum. The QCM reached the reaction temperature in a matter of minutes and had sufficiently low baseline drift within approximately 20 minutes—the typical period used for sample warm-up and outgassing—thus introducing no additional delay in the process. The inset shows a zoomed portion of the QCM signal highlighting that the noise is less than 2 ng, with no obvious thermal drift over the 500 s time duration (for reference, one ALD cycle of $Al_2O_3$ cycles deposits ~32 nm/cm$^2$).

To further reduce thermal drift, two additional measures were taken to minimize temperature fluctuations and reduce the temperature sensitivity of the QCM sensor. Tuning of the PID temperature controllers through the Savannah ALD software minimized reactor temperature fluctuations to less than ±0.2° C. of the set point temperature. Additionally, a fiber insulation pad was placed around the ALD chamber and on top of the modified ALD lid in order to reduce temperature fluctuations associated with changes in the room ambient.

Figure 2B:
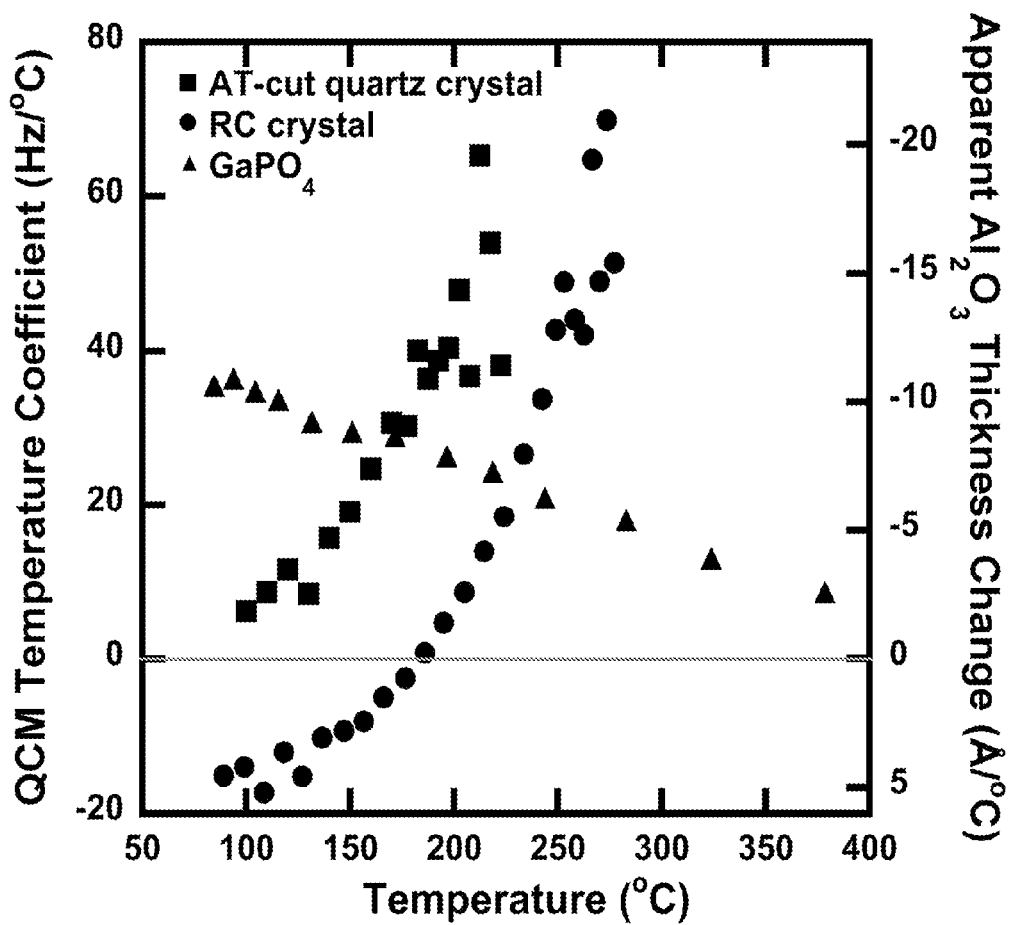
FIG. 2(b) is a graph of temperature coefficients for different QCM crystal types.

Temperature effects may also be minimized by switching to a different sensor crystal with a lower temperature coefficient. FIG. 2b shows the temperature coefficient as a function of reactor temperature for three different commercially available sensor crystals. The right axis displays the calculation of apparent ALD $Al_2O_3$ thickness change. RC (ColnaTec, Inc.) and AT-cut (Inficon) crystals were measured independently with the integral QCM, while the $GaPO_4$ data is reproduced from published data (Elam et. al., Rev. Sci. Instr. 73, 2981-2987 (2002), the entirety of which is incorporated by reference. A thermocouple was temporarily attached to the lid to accurately measure the temperature of the crystals. A ramp of the ALD reactor temperature was executed while monitoring in the sensor frequency, and the temperature coefficients were calculated from the derivative of oscillation frequency versus temperature. An "apparent $Al_2O_3$ thickness change" is plotted on the right axis (assuming an ALD-$Al_2O_3$ density of 3.0 g/cm$^3$) for reference. In the temperature range between 150 and 225° C. the RC crystals outperform both the AT-cut and the $GaPO_4$ crystals as evidenced by the lower absolute values for the QCM temperature coefficient of the RC crystal in this temperature range. (The design of the aperture and mounting structure permits quick replacement of the alternative crystals as the need arises.) The right axis displays the calculated apparent $Al_2O_3$ thickness change.

Accurate Mass
Calibration Detail

Because ALD is not a "line-of-sight" deposition technique, the precursors can diffuse to every reactive site including the backside of the crystal unless preventative measures are taken. The wall-mounted integral QCM includes a backside purge of ultra-high purity $N_2$ to prevent growth on the backside of the sensor. To demonstrate the benefit of this active precursor diffusion barrier, $Al_2O_3$ was deposited using both standard pulse (continuous flow) mode and under quasi-static (exposure mode) conditions. As high vapor pressure and low molecular weight precursors, both TMA and water test the limits of the precursor diffusion barrier strategy. Both QCM ports were used: the "inlet" QCM port was positioned 2 in from the inlet and the "outlet" QCM port was positioned 6 in from the inlet. As the backside purge flow rate was varied, a total of 20 ALD cycles were executed at each setting and the growth rate was determined by averaging the rate per step over the last 10 cycles.

Figure 3A:
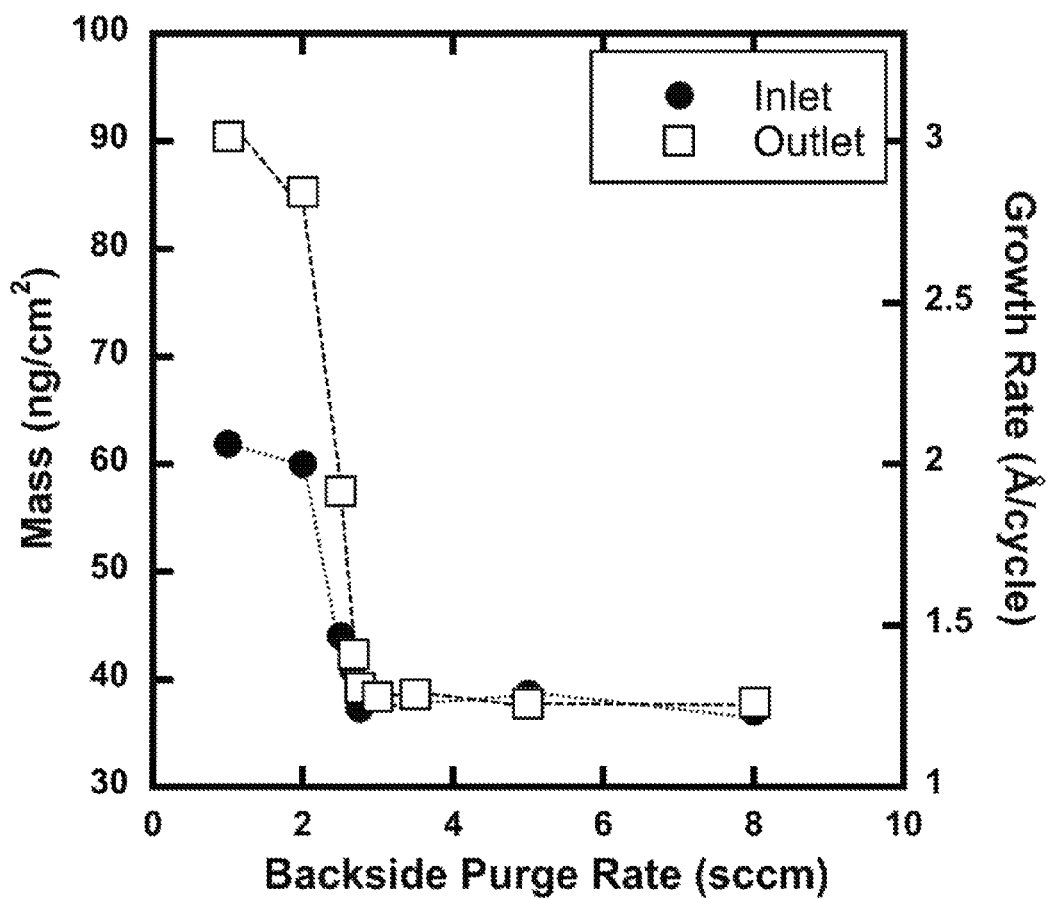
FIGS. 3a-b. are graphs of mass (left axis) and growth rate (right axis) vs. Purge Rate (sccm) of the process under quasi-static and continuous growth conditions respectively, in accordance with features of the present invention.
Figure 3B:
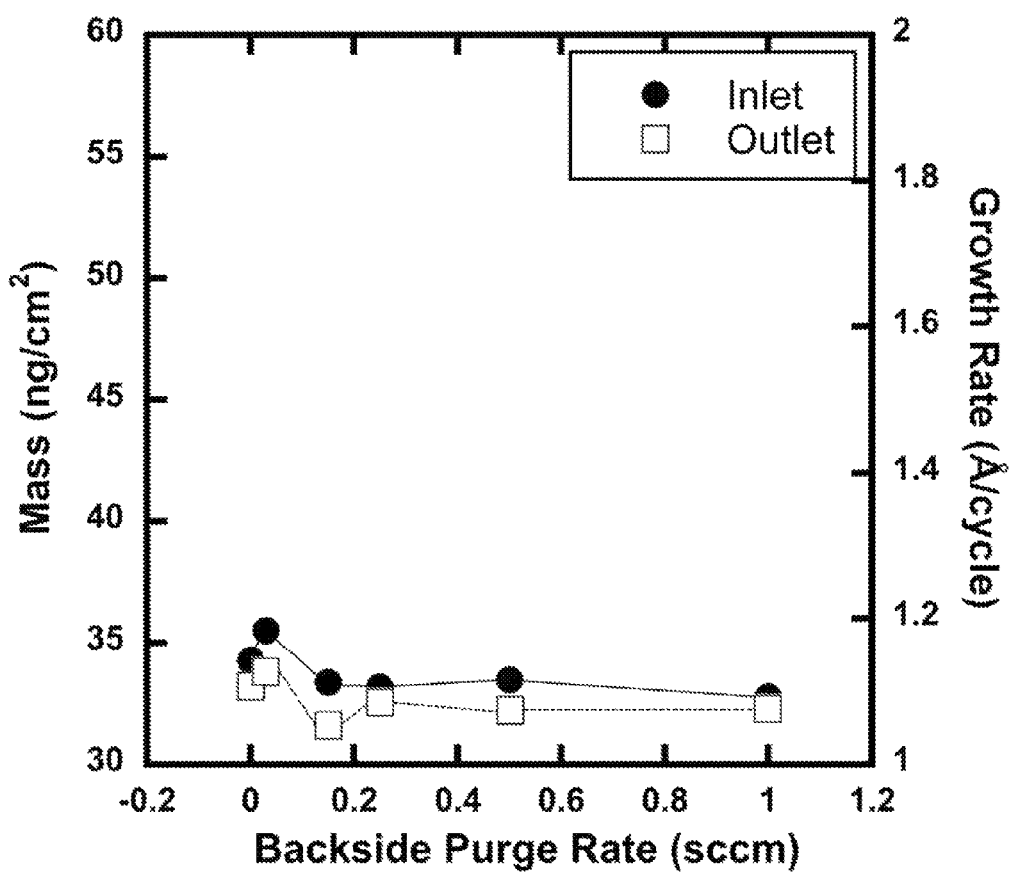

FIGS. 3a and 3b show the effects of backside purge rate on the deposition rate for quasi-static and continuous flow mode, respectively. FIG. 3a is a graph of the process under quasi-static growth conditions (0.015 second pulse with a 2 second exposure for both water and TMA, each followed by a 20 second purge). The growth rate for $Al_2O_3$ was determined as a function of the purge flow across the back of the QCM crystals. The left axis is the mass change in nanograms per cycle, while the growth rate of $Al_2O_3$—calculated assuming a density of 3.0 g/cm$^3$—is on the right axis. When the backside purge rate was reduced below 2.5 sccm, the growth rate nearly doubled indicating that deposition was occurring on both the front and back of the QCM crystal (FIG. 3a). The growth rate of the inlet QCM port maintained a growth rate of about 2 Å/cycle, while the outlet QCM growth rate continued to increase to about 3 Å/cycle. That is, in the low flow regime, the rate exceeded twice that expected for $Al_2O_3$ ALD suggesting additional, non-self-limiting growth occurred in the space behind the QCM crystal—likely a result of precursor mixing due to insufficient purging of physisorbed reactants. A means for preventing this film accumulation prevents this from occurring. One such means is increasing the a backside purge rate. For example, of 2.75 sccm purge rate is suitable.

While the backside purge flow has virtually no effect on the deposition rate under continuous flow conditions (except under zero back purge flow condition, where the effect is small, FIG. 3b (S2)), the effect of the backside purge rate during quasi-static conditions is substantial. FIG. 3b is a graph of the growth rate for $Al_2O_3$, in continuous flow (pulse) mode. The rate is seen as a function of the purge flow rate over the back (i.e., exterior surface 36) of the QCM crystals. The timing for the $TMA/H_2O$ cycles was 0.015-20-0.015-20. The growth rate remained constant for purge rates>0.2 sccm over the back of the QCM crystal.

The backside purge gas is beneficial for accurate mass calibration. The invented design is such the flow through the entry port 94 does not disturb the normal precursor flow in the ALD chamber. To verify that the backside purge gas did not perturb the deposition, a test was performed for 600 cycles of Pt ALD using (trimethyl)cyclopentadienylplatinum(IV) (99%, Strem) and molecular oxygen. Pt was selected due to its low vapor pressure, sensitivity to substrate cleanliness, and the fact that it provides a distinct change in the reactor appearance with only a few nanometers of film. The pulse sequence was 1-10-1-10 and the reactor temperature was 190° C.

Figure 4:
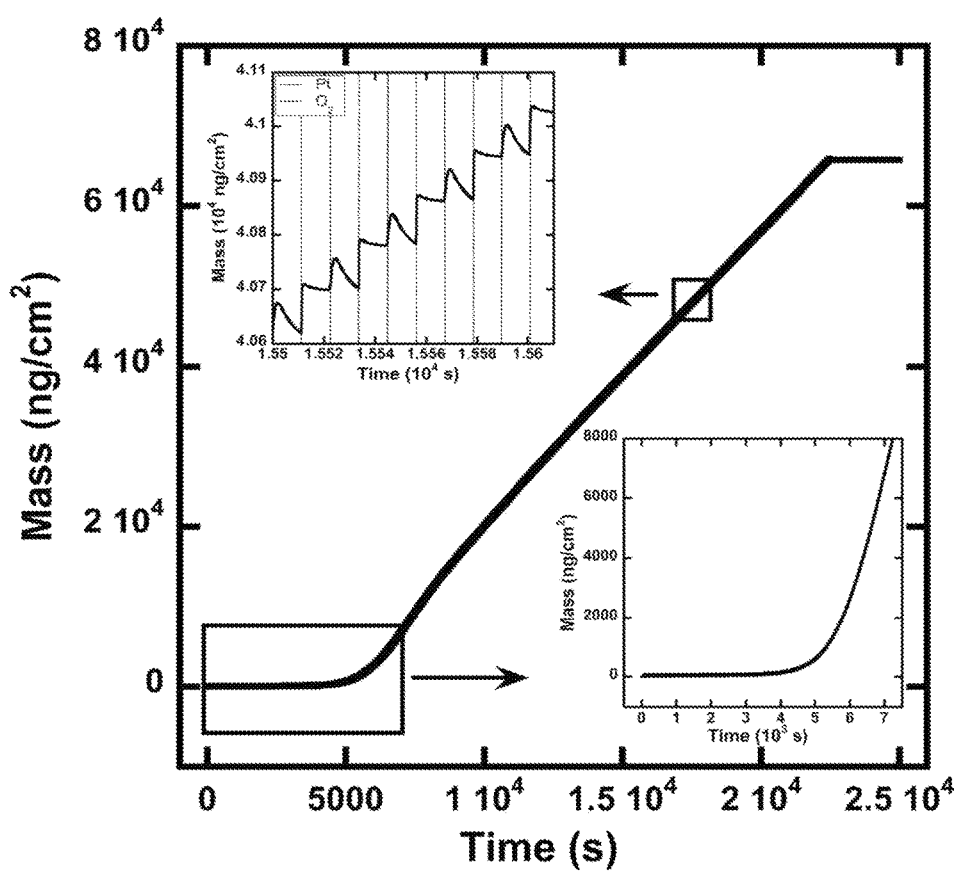
FIG. 4 is a graph of mass (ng/cm2) verses Time (sec)

Preventing backside ALD is not only key to obtaining accurate mass calibration but also preferable to prevent wrap-around of conductive ALD materials. Conductive material deposited on the back of the QCM crystal will electrically short the two electrodes that drive the crystal oscillation, rendering it inoperable. FIG. 4 shows the successful in situ QCM monitoring during Pt ALD using the backside purge. QCM data demonstrates the deposition of Pt metal at 190° C. using alternating exposures to trimethyl (methylcyclopentadienyl)platinum(IV) and $O_2$. The zoomed region from 0 to 7000 seconds shows the nucleation delay over a period of ~150 cycles, while the region between $1.55 \times 10^4$ and $1.575 \times 10^4$ s highlights a mass gain of 83.33 ng/cycle. This corresponds to a growth rate of 0.4 Å/cycle.

FIG. 4 highlights nucleation and steady-state growth. The nucleation region occurs in the first 10000 s and is highlighted in the inset on the bottom right. From this a nucleation delay over a period of ~150 cycles was determined. The steady-state growth region is displayed in the upper left inset and demonstrates the ability of the QCM to resolve the individual steps of each half-reaction. Using the bulk density of Pt, the growth rate was calculated to be 0.4 Å/cycle.

Positive-going transient features accompanying each $O_2$ exposure likely result from transient heating induced by the exothermic combustion of the organic ligands on the Pt surface. A similar transient feature was observed previously during Pt and Ir ALD, but in the negative mass direction. This difference in sign is depicted in FIG. 2b and also by noting that the earlier application used conventional AT-cut sensors which have a temperature coefficient that is opposite in sign as compared to the RC sensors.

Purge Flow
Efficiency Detail

In the integral wall-mounted QCM design, a lip and O-ring system provide electrical contact to the front of the QCM crystal (see FIG. 1b). A "purge gap" between the inner diameter of the lip and crystal has been included to reduce the propensity for dead ends—precursor-accessible portions of the reactor that experience insufficient sweep gas (purge flow). Dead ends may act as a chemical precursor trap where gas phase mixing of reactants and/or products can occur, the result of which is non-uniform growth and powder formation.

To evaluate the extent to which the invented design minimizes dead ends, both TMA and water were overdosed by a factor of five, thereby magnifying any effects due to precursor mixing or otherwise non-self-limiting growth. In pure ALD, half-reactions will be self-limiting such that introducing additional precursor into the reaction chamber will not increase the growth rate.

Figure 5A:
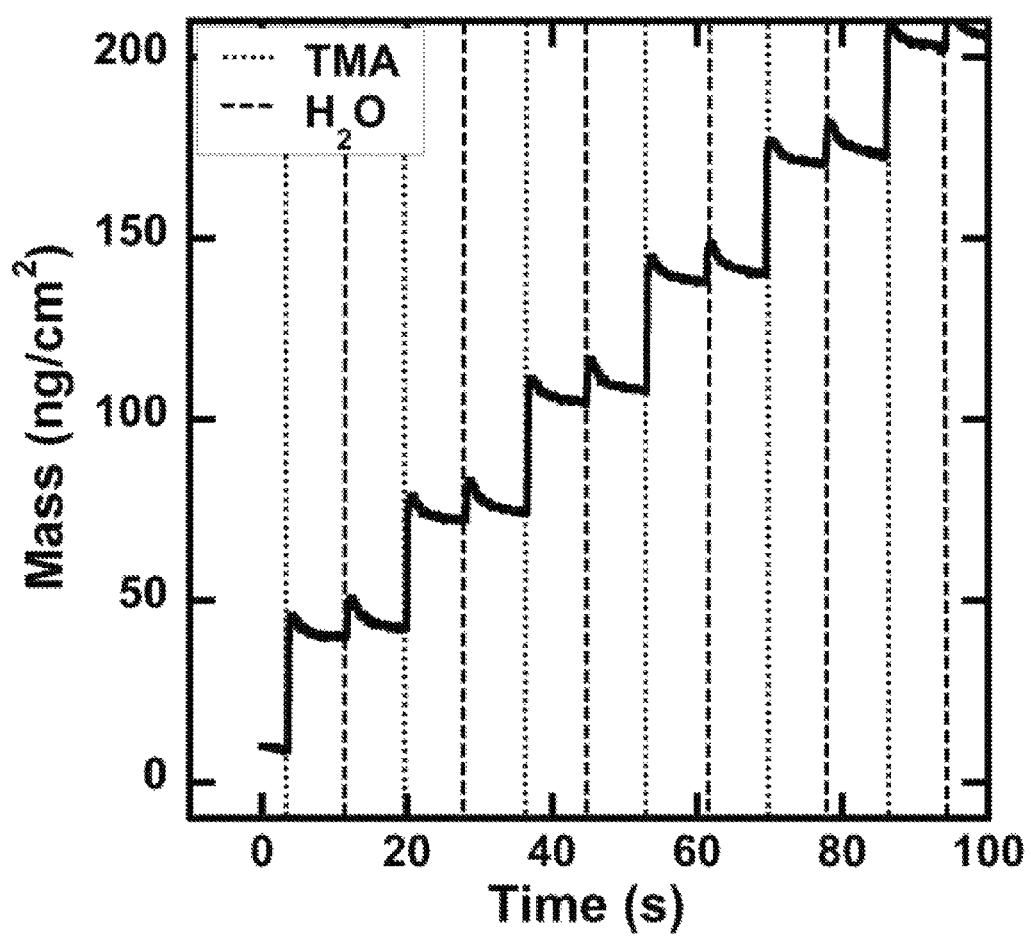
FIGS. 5a to 5d are graphs of mass verses time for different pulse sequences, illustrating $Al_2O_3$ mass gain at 190° C., in accordance with features of the present invention.
Figure 5B:
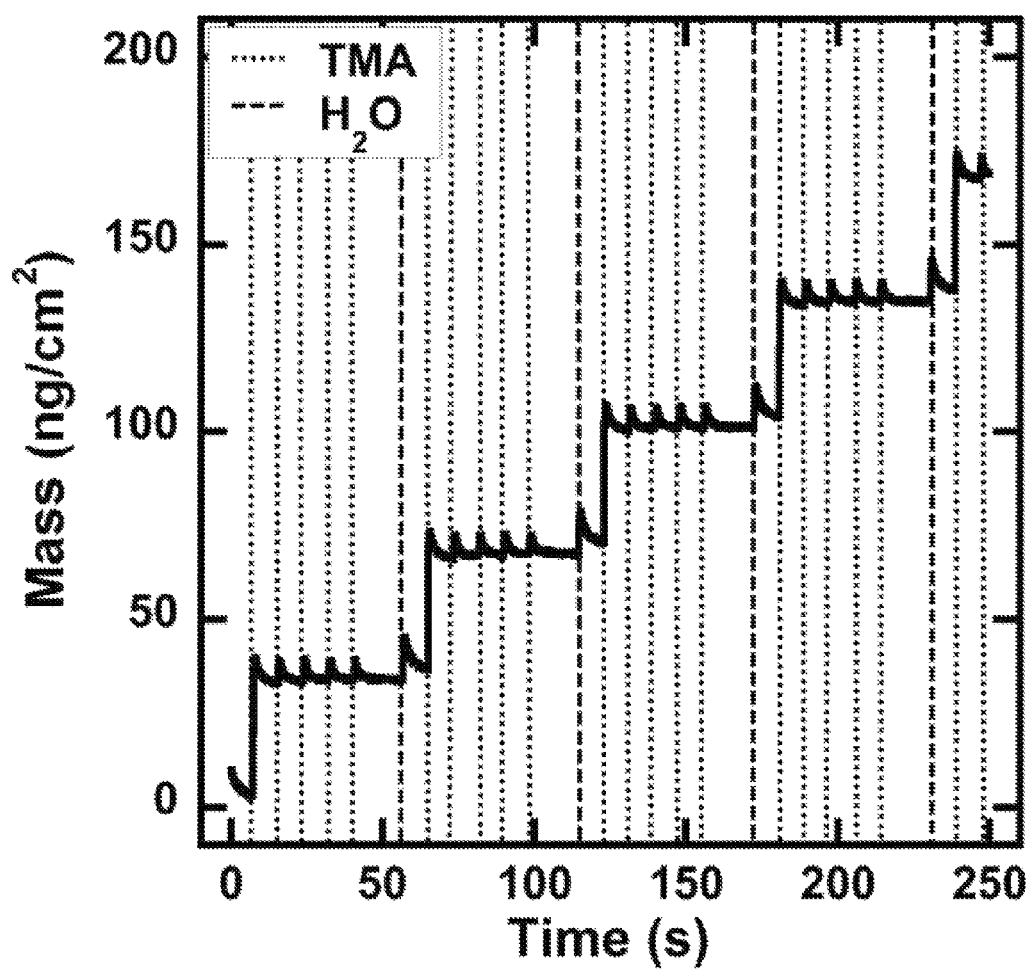
Figure 5C:
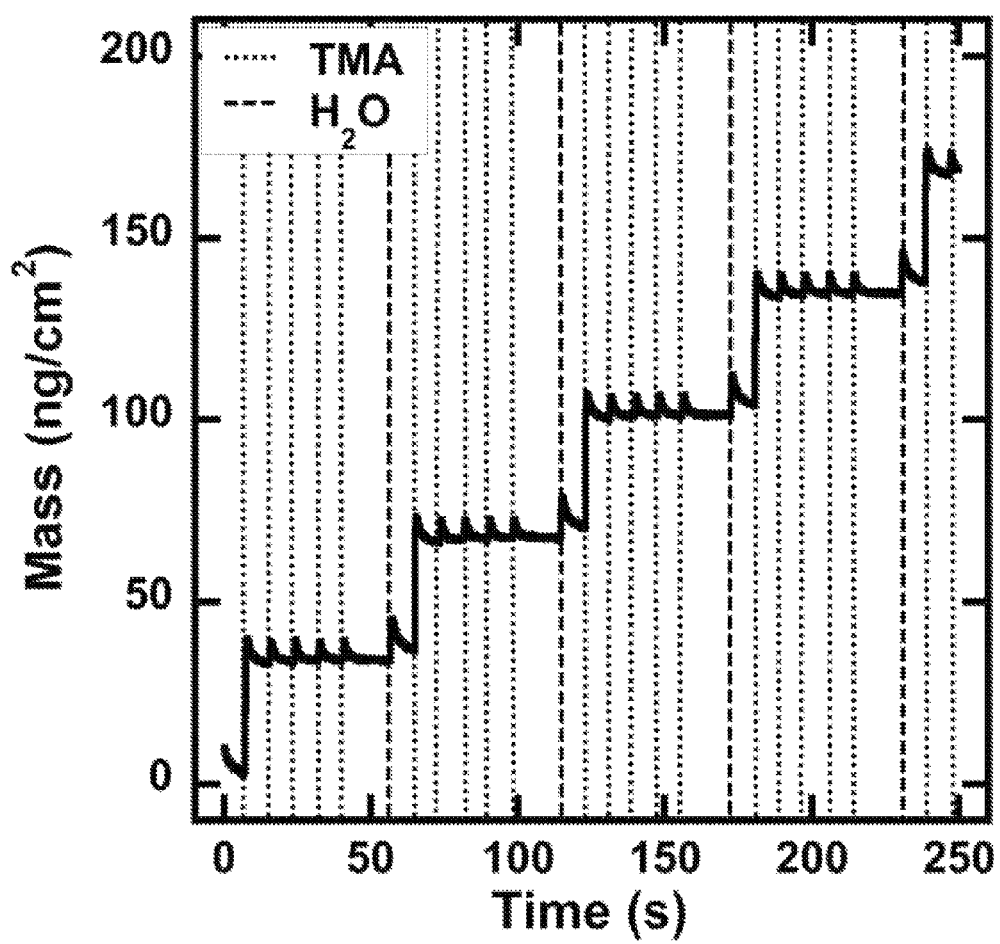
Figure 5D:
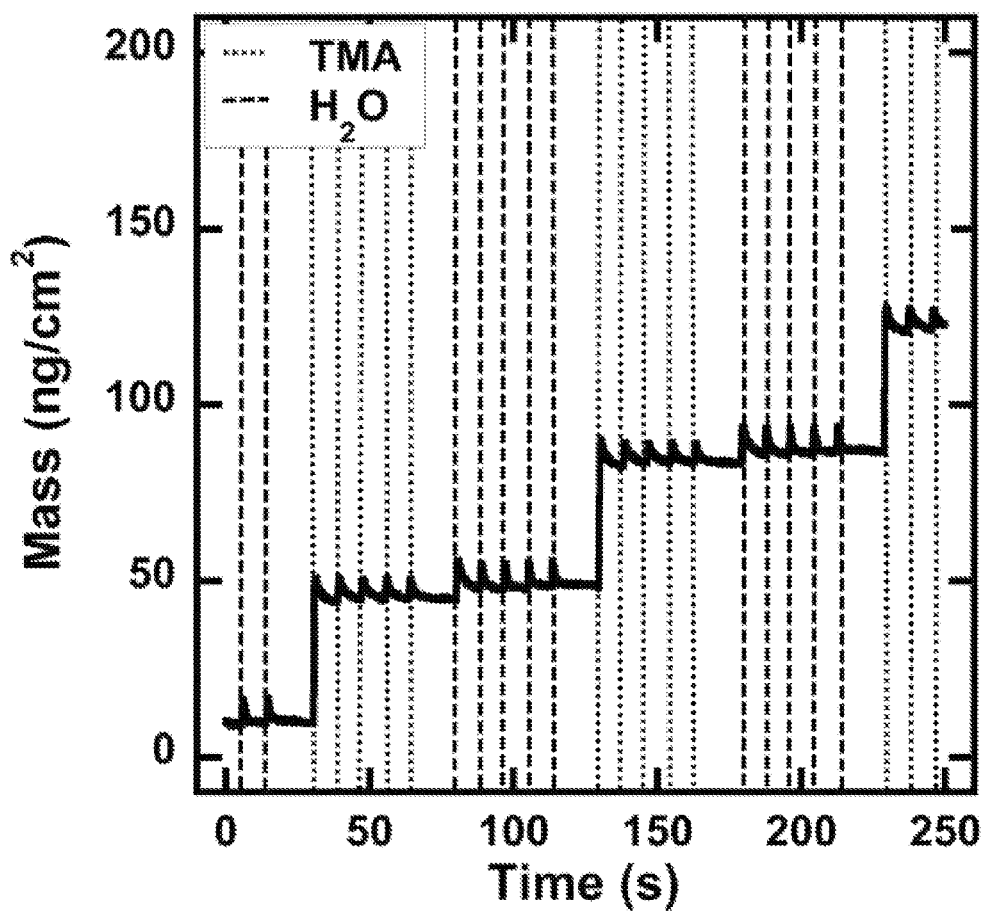

Deposition steps as a function of the number of pulses are shown in FIG. 5a-5d. These figures illustrate $Al_2O_3$ mass gain at 190° C. measured at the outlet using the pulse sequence x(0.015-8)-y(0.015-8), where (a) x=1=y, (b) x=5, y=1, (c) x=1, y=5, and (d) x=5=y. Each successive pulse was separated by an 8 s purge. The standard 1:1 pulse ratio of $TMA:H_2O$, depicted in FIG. 5A, yielded a growth rate of 1.1 Å/cycle. FIGS. 5b, c, and d show the mass deposited using pulse ratios of 5:1, 1:5, and 5:5 respectively. In all cases, multiple pulses did not increase the growth rate. Furthermore, consecutively pulsing the TMA precursor 100 times did not result in additional mass gain.

Figure 6A:
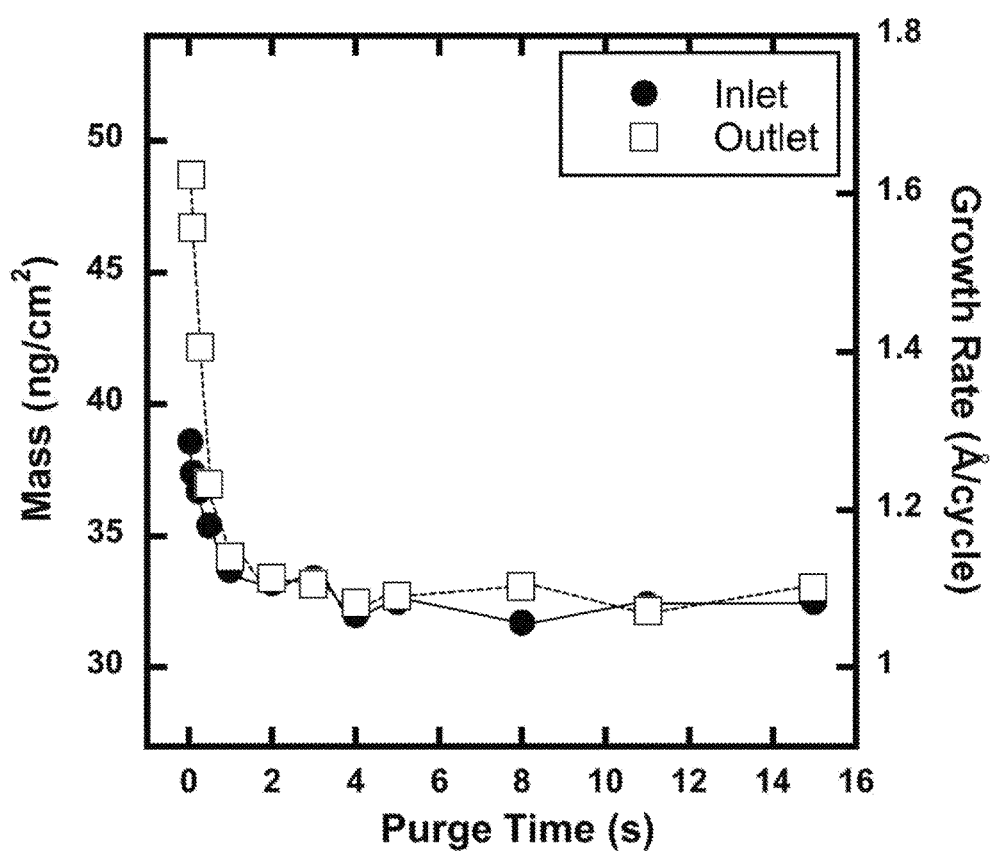
FIGS. 6a and 6b are graphs of mass verses time.
Figure 6B:
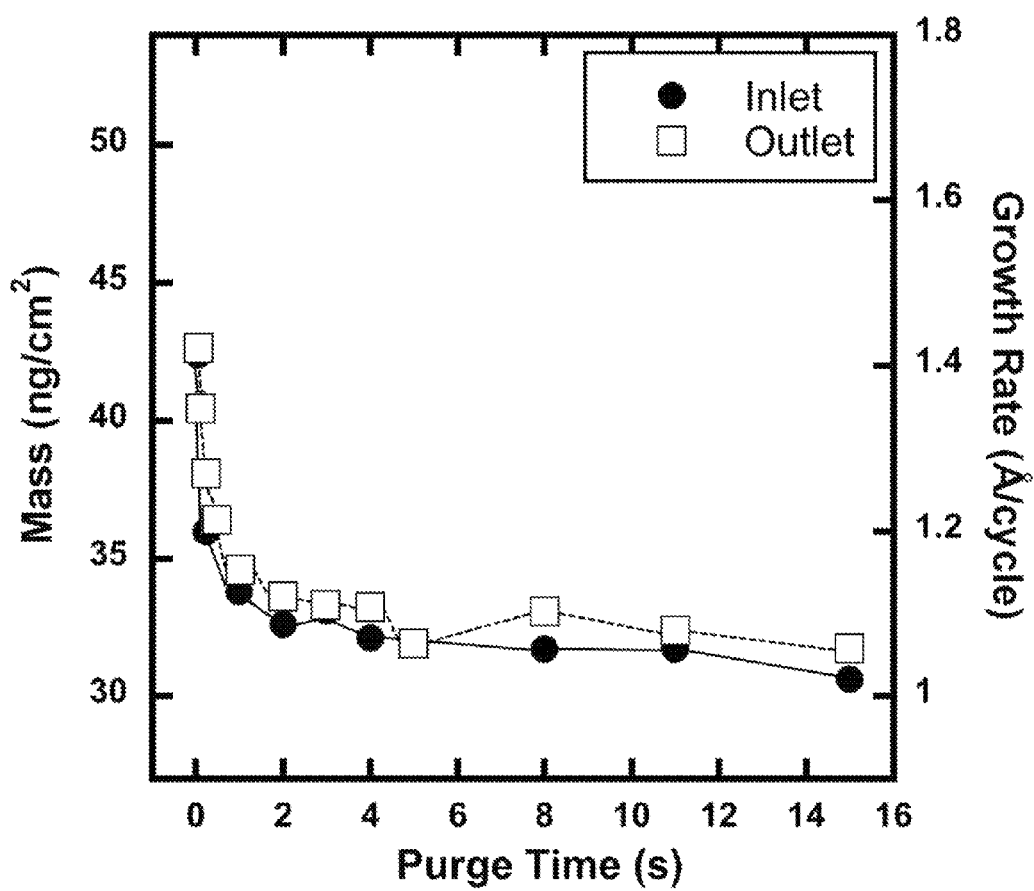

The purge time following both TMA and water pulses were also investigated to determine the minimum time required to efficiently remove all unreacted precursor from the reaction chamber. FIGS. 6a and 6b illustrate the $Al_2O_3$ growth rate dependence of purge time at 190° C. following each half reaction. In (a) the purge time following the TMA dose was varied using the sequence 0.015-x-0.015-8 and in (b) the sequence 0.015-8-0.015-y was used to evaluate the effect of $H_2O$ purge time. Purge times are determined empirically. (The purge time for the $Al_2O_3$ process at this temperature in an unmodified ALD tool is eight seconds.)

FIG. 6 display plots of the growth rate versus purge time following a) TMA and b) $H_2O$. The plots show that the integrated QCMs do not require additional purge time. The inlet and outlet QCM ports display similar trends; for purge times greater than 1 s following TMA, with the growth rate was maintained at 1.1 Å/cycle. Below one second, the growth rate increased rapidly, suggesting insufficient purging. Similarly, at purge times greater than 2 s following a water pulse the growth rate was 1.1 Å/cycle. At shorter purge times the growth rate increased. These results, in combination with the aforementioned multi-pulse study, indicate that the low profile design and lip and O-ring purge gap produce little to no disturbance to standard reactor operation.

Dual Port
Capability Detail

Due to the small footprint of the integral wall-mounted QCM fixture, both inside and outside the tool, multiple QCM ports may be mounted on a single tool. Multi-QCM capabilities provide the opportunity to map the mass deposition as a function of location within the reactor in real time. Although ALD is designed to produce uniform growth over a wide range of precursor exposures, temperatures, and purge conditions, trade-offs are frequently encountered. For example, higher deposition temperatures may result in better dielectric properties but at the cost of precursor thermal decomposition that results in an exposure-dependent growth rate.

Exposure-dependent nucleation rates, hot and cold spots, non-uniform flow under increased purge conditions, and precursor consumption by porous or high-surface area substrates can all lead to thickness non-uniformities during ALD. Typically, the process of identifying and rectifying these problems is laborious and time-consuming requiring many rounds of ALD on wafers followed by ex situ thickness measurements. However, this process can be performed rapidly and easily using in situ multi-point mapping such as what are enabled with a multisensor configuration depicted in FIGS. 8 and 9. Roughly 23 ports could be packed onto the 30 cm diameter lid depicted in FIG. 1A. Signals are processed by the same SQM-160 thickness monitor.

Figure 7:
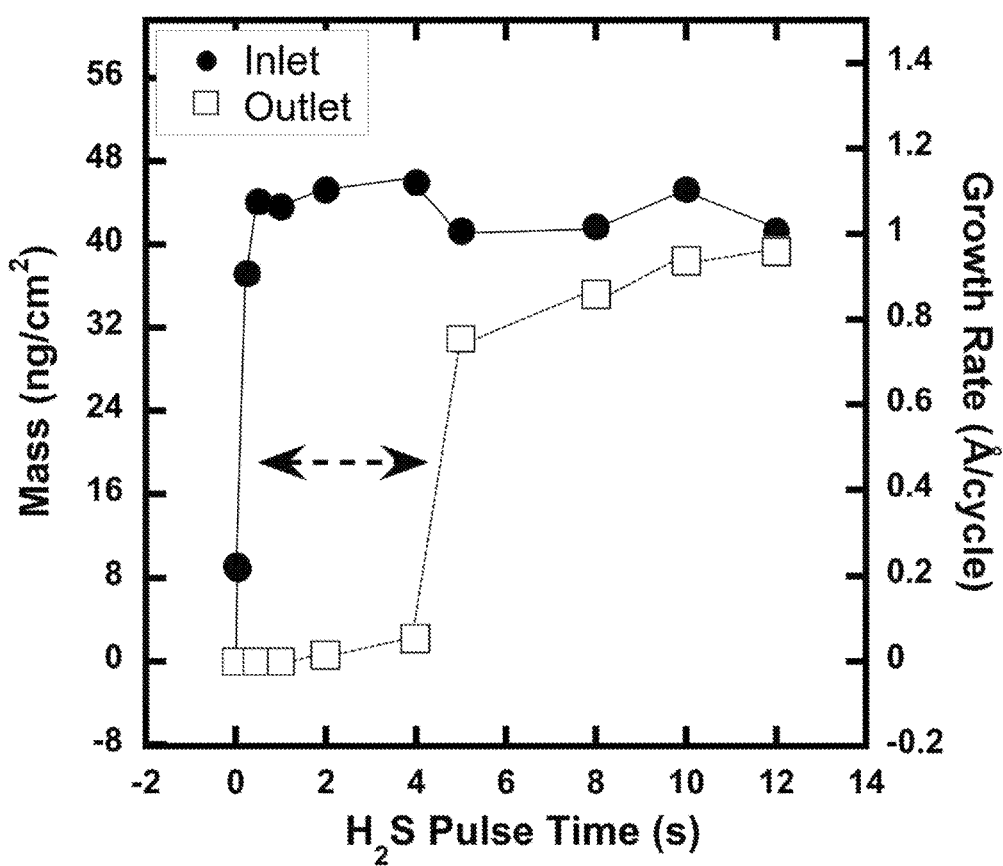
FIG. 7 is a graph mass verses $H_2S$ Pulse time (s)

To evaluate the effectiveness of dual port capability, ALD ZnS was used as a model system. Like TMA, DEZ rapidly and completely saturates the commercial ALD chamber with even the shortest achievable dose (0.015 s); however, the $H_2S$ dose pressure can be easily reduced to produce subsaturating conditions by lowering the differential delivery pressure. This allows one to monitor the $H_2S$ wave front travel through the chamber as function of $H_2S$ dose time, as depicted in FIG. 7. The growth rate at the inlet QCM port showed saturation with just a 0.5 s $H_2S$ dose. This compares to an eight second $H_2S$ pulse required to reach saturating conditions at the outlet QCM port. This difference in the required $H_2S$ pulse time between the inlet and outlet QCM ports—which were intentionally exacerbated for illustrative purposes—highlights the benefit of dual port capabilities. FIG. 7 illustrates ZnS growth rate near the inlet (circles) and outlet (squares). ZnS was deposited at 140° C. using diethylzinc and $H_2S$ with a pulsing sequence of 0.015-12-x-12, where x is the $H_2S$ pulse time.

An integral, wall-mounted QCM fixture with a low profile was designed to meet the specific needs of ALD systems. The experiments demonstrated the use of the wall-mounted integral QCM design for in situ characterization of films comprised of a myriad of elements and compounds, including, but not limited to, $Al_2O_3$, ZnS, and Pt, The invented system is equally applicable for other physical and chemical vapor deposition tools, especially those with the capability to deposit upon and within modest aspect ratio features. Several new design elements were incorporated: 1) compact electrical and purge gas connections on a single, small bolt-on fixture; 2) the ability to integrate directly into a reactor wall, lid, or flange; 3) a multiple O-ring seal and compression sleeve system that prevents ALD on the back of the crystal and allowing rapid and simple crystal exchange; 4) a low-profile lip and O-ring system that affords effective electrical contact to the front of the crystal without increasing the required purge time; 5) a compact footprint that enables multi-point thickness mapping; 6) superior thermal equilibration following sample exchange. When taken together, the design improves the accuracy of and significantly reduces the barrier to routine QCM measurements in a variety of ALD tools.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. For example, FIGS. 8A-B are plan and elevated views, respectively, of multi-oscillating crystal configurations for a disk-shaped ALD reactor lid geometry. FIG. 9 is a schematic view of a multi-oscillating crystal configuration, wherein the crystals are arranged along a longintudinally extending region of a cylindrically-shaped ALD reactor.

Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

While the invention has been particularly shown and described with reference to a preferred embodiment hereof, it will be understood by those skilled in the art that several changes in form and detail may be made without departing from the spirit and scope of the invention.

The invention claimed is:

1. A system for monitoring atomic layer deposition onto a workpiece, the system comprising:
    an ALD chamber having an interior and exterior surface adapted to receive the workpiece in the interior of the ALD chamber, wherein the ALD chamber has a lid corresponding to the top of the ALD chamber, said lid having a first surface and a second surface, wherein at least one aperture traverses the thickness of the lid, and wherein the ALD chamber is in fluid communication with at least one precursor inlet;
    a piezoelectric element having a first surface in fluid communication with the interior of the ALD chamber and a second surface that is physically and chemically isolated from the interior of the ALD chamber, said piezoelectric element being adjustably mounted to the chamber, wherein the piezoelectric element is recessed from the interior surface of the chamber within said at least one aperture;
    a purge gas line in fluid communication with and upstream of each of the at least one precursor inlet; and
    an external conduit, wherein said external conduit is in fluid communication with the purge gas line and the second surface of the piezoelectric element, wherein the aperture is configured to reversibly receive said purge gas, and wherein said aperture is not in fluid communication with the interior of the ALD chamber.

2. The system as recited in claim 1 wherein a plurality of spacers vary the distance between the piezoelectric element and the workpiece.

3. The system as recited in claim 1, wherein the piezoelectric element is reversibly secured between two deformable gaskets and wherein the gaskets provide the physical and chemical isolation between the first and second surfaces of the piezoelectric element.

4. The system as recited in claim 1, wherein the piezoelectric element is reversibly mounted to the chamber.

5. An atomic layer deposition chamber, said chamber comprising:
    a three dimensional enclosure, said enclosure adapted to receive a workpiece, wherein at least one precursor gas line and a purge gas line are in fluid communication with an interior of the enclosure;
    a chamber lid corresponding to the top of the enclosure, said lid having a first surface and a second surface, wherein at least one aperture traverses the thickness of the chamber lid and wherein a ledge extends medially from a portion of each of the at least one aperture proximal to the second surface of the chamber lid, wherein the second surface of the chamber lid is substantially flat; and
    a deposition thickness sensor reversibly placed in each aperture, each of said deposition thickness sensors comprising:
        a first gasket in physical contact with the ledge;
        a piezoelectric element having a first surface and a second surface, wherein the second surface of the piezoelectric element is in physical communication with the first gasket and in electrical communication with the ledge;
        a second gasket in contact with the first surface of the piezoelectric element, wherein the first and second gaskets physically and chemically isolate the first surface of the piezoelectric element from the second surface of the piezoelectric element;
        a spring electrode in electrical communication with the first surface of the piezoelectric element;
        a sleeve having an outside diameter equal to or slightly smaller than the diameter of the at least one aperture, wherein the sleeve mechanically engages the second gasket;
        a coupling in mechanical communication with the spring electrode, wherein the coupling is interior to the sleeve such that a void space is created between the coupling and the inside surface of the sleeve; and
        a flange having a central aperture and a gas line in fluid communication with the purge gas line, wherein the flange mechanically engages the sleeve, wherein the flange reversibly attaches to the first surface of the lid, and wherein an electrical communication path is provided from the coupling through the central aperture of the flange, wherein each deposition sensor is recessed from the second surface of the substantially flat lid, and wherein said at least one aperture is not in fluid communication with said interior of the enclosure.

6. The chamber of claim 5, wherein the piezoelectric element is a quartz crystal.

7. The chamber of claim 5, wherein the coupling is connected to a bayonet nut connector feedthrough.

8. The chamber of claim 5, wherein a conductive spacer is placed around the first gasket such that the conductive spacer is in electrical communication with the piezoelectric element and the interior surface of the aperture.

9. The chamber of claim 5, wherein there are two or more apertures and deposition thickness sensors.

10. The system as recited in claim 1 wherein the ALD chamber is maintained at between 300 mTorr and −710 Torr.

11. The system as recited in claim 1 wherein the gas purge line is a single purge gas source that charges the first surface of the piezoelectric element, the second surface of the piezoelectric element and the ALD reaction chamber with an inert gas all at the same pressure and volume.

12. The system as recited in claim 1 wherein pressure applied to the second surface of the piezoelectric element is slightly positive relative to the ALD chamber.

13. The system as recited in claim 1 wherein exterior surfaces of the external conduit are not in fluid communication with the reaction chamber.

14. The system as recited in claim 5 wherein the gaskets are compressed by the sleeve, and wherein the compression imparted by the sleeve generates a hermetic seal between the two sides of the piezoelectric element and places the second surface of the piezoelectric element in contact with the ledge.

* * * * *